(12) United States Patent
Chang et al.

(10) Patent No.: US 10,658,011 B2
(45) Date of Patent: May 19, 2020

(54) VOLTAGE GENERATING SYSTEM, VOLTAGE GENERATING CIRCUIT AND ASSOCIATED METHOD

(71) Applicant: TAIWAN SEMICONDUCTOR MANUFACTURING COMPANY LTD., Hsinchu (TW)

(72) Inventors: Yen-An Chang, Miaoli County (TW); Yi-Chun Shih, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/191,909

(22) Filed: Nov. 15, 2018

(65) Prior Publication Data

US 2020/0019206 A1 Jan. 16, 2020

Related U.S. Application Data

(60) Provisional application No. 62/698,507, filed on Jul. 16, 2018.

(51) Int. Cl.
*G11C 5/14* (2006.01)
*H02M 3/07* (2006.01)
*H03K 5/135* (2006.01)

(52) U.S. Cl.
CPC .............. *G11C 5/145* (2013.01); *H02M 3/07* (2013.01); *H03K 5/135* (2013.01)

(58) Field of Classification Search
CPC ..... G11C 5/145; H02M 3/07; H02M 2003/075; H02M 2003/076; H03K 5/135
USPC .......................................... 327/100, 102, 536
See application file for complete search history.

(56) References Cited

U.S. PATENT DOCUMENTS 5,748,032 A * 5/1998 Baek ....................... G11C 5/145
327/536
2005/0195017 A1* 9/2005 Chen ....................... H02M 3/073
327/536

* cited by examiner

*Primary Examiner* — William Hernandez
(74) *Attorney, Agent, or Firm* — WPAT, P.C., Intellectual Property Attorneys; Anthony King

(57) ABSTRACT

A voltage generating system including: a voltage source, a clock generating circuit, and a voltage generating circuit. The voltage source generates a reference voltage. The clock generating circuit generates a first clock signal and a second clock signal according to the reference voltage. The voltage generating circuit including an output circuit and a switch circuit. The output circuit generates a control signal at a control node according to the first clock signal and the reference voltage, generates an output signal at an output node according to the second clock signal and the reference voltage. An absolute value of an amplitude of the output signal is greater than the reference voltage while an absolute value of an amplitude of the control signal is greater than the reference voltage. The switch circuit selectively outputs the output signal to an output terminal according to the control signal.

20 Claims, 22 Drawing Sheets

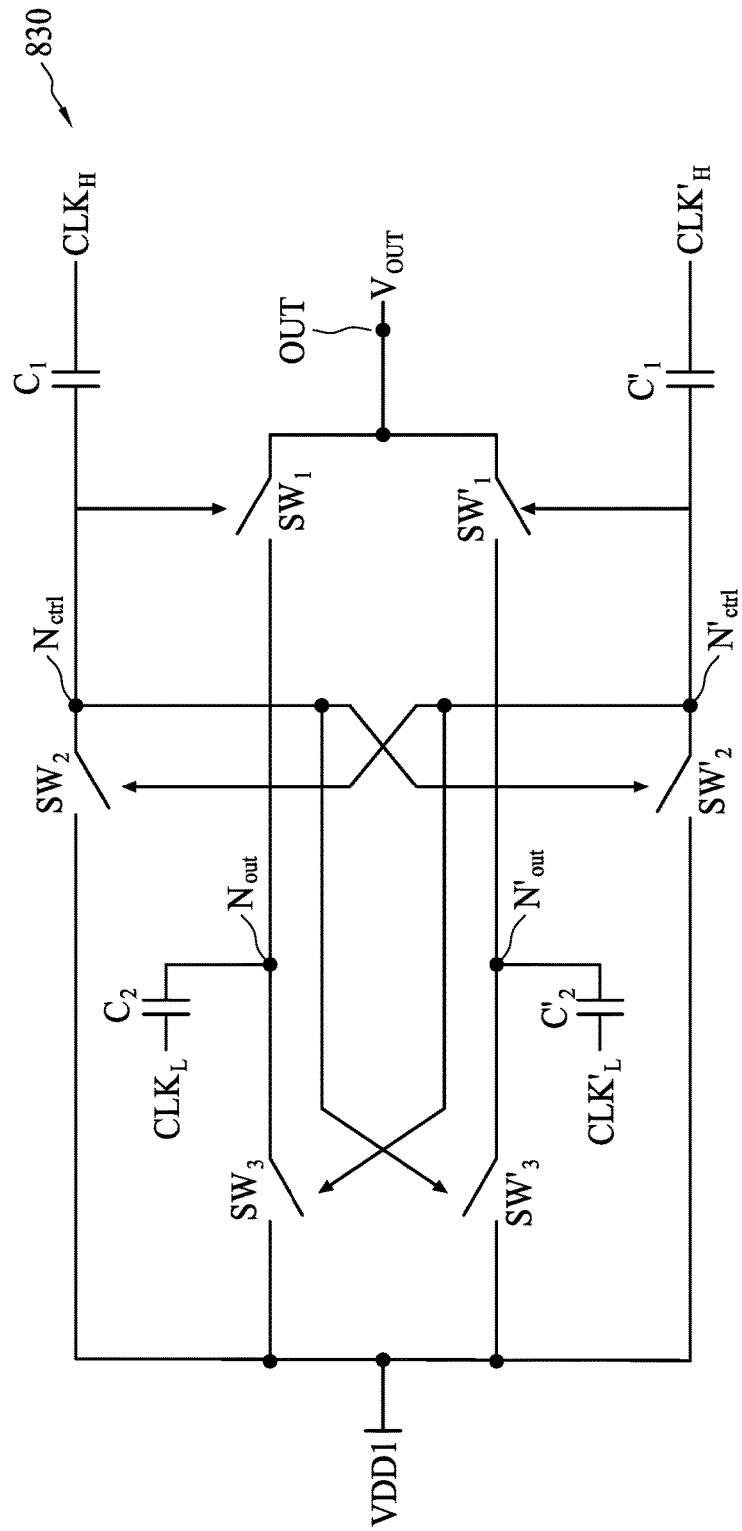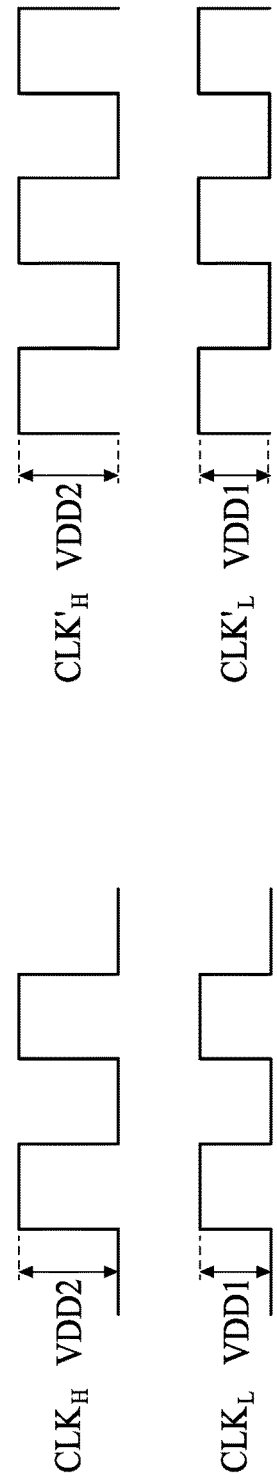
FIG. 8

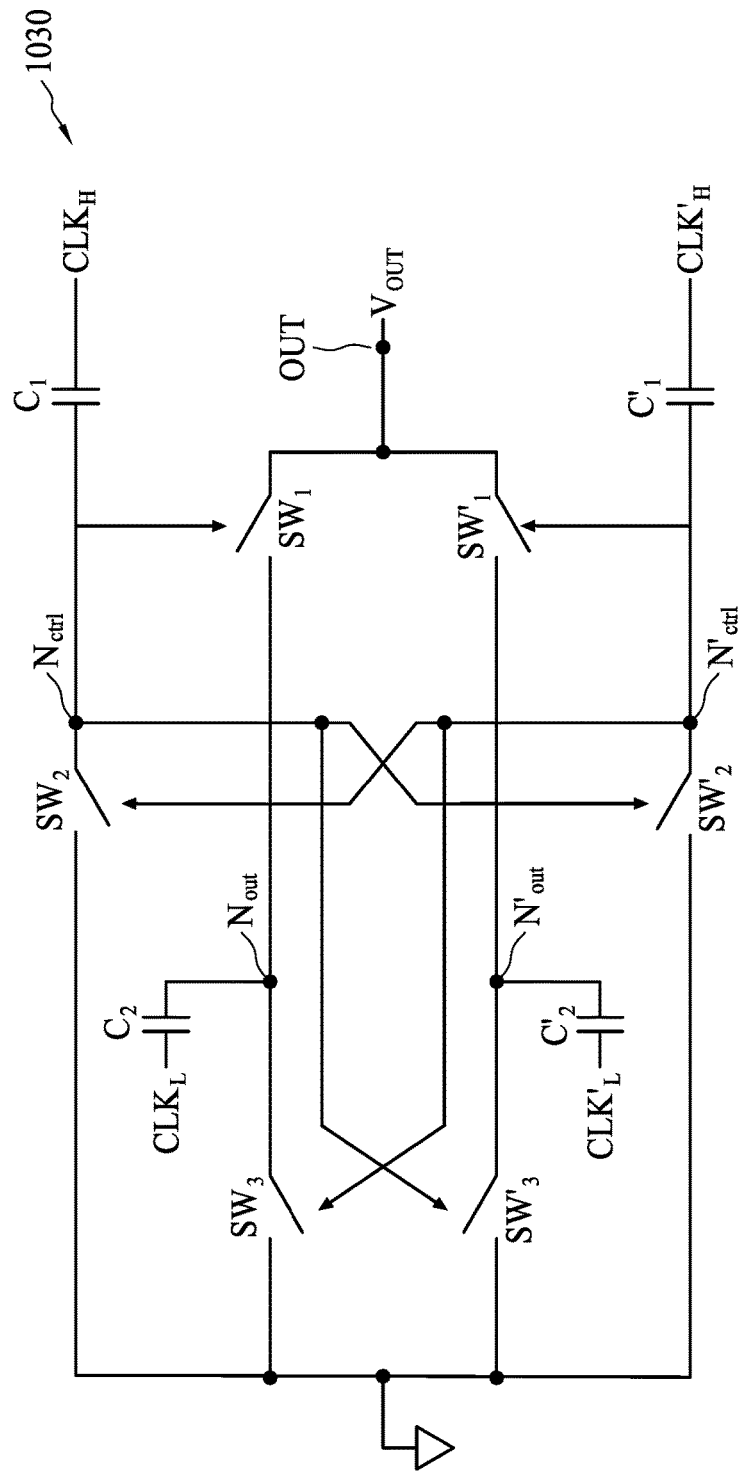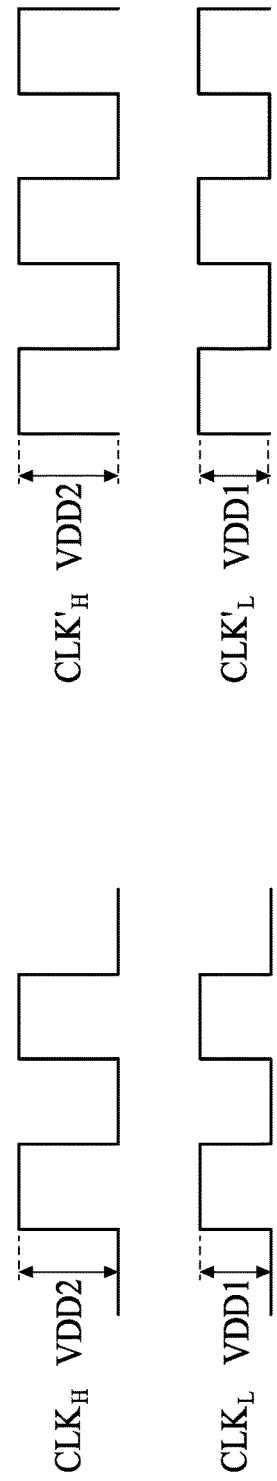
FIG. 10

VOLTAGE GENERATING SYSTEM, VOLTAGE GENERATING CIRCUIT AND ASSOCIATED METHOD

CROSS-REFERENCE TO RELATED APPLICATION

This application claims the benefit of U.S. Provisional Application No. 62/698,507, filed on Jul. 16, 2018, which is incorporated by reference in its entirety.

BACKGROUND

For low power memory, charge pumps are required to generate voltages over the power supply voltage or below the ground bias voltage to reduce leakage current and improve access speed. Therefore, the current efficiency of charge pumps is important when the power or current consumption is considered. Existing multi-phase charge pumps with single-rail bias control, however, may not have desirable charge transferring ability. If higher voltages are required, the existing design may become more complicated and a larger size will be consumed at each stage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a diagram illustrating a voltage generating circuit according to another embodiment of the present disclosure.

FIG. 10 is a diagram illustrating a voltage generating circuit according to another embodiment of the present disclosure.

DETAILED DESCRIPTION

Figure 1:
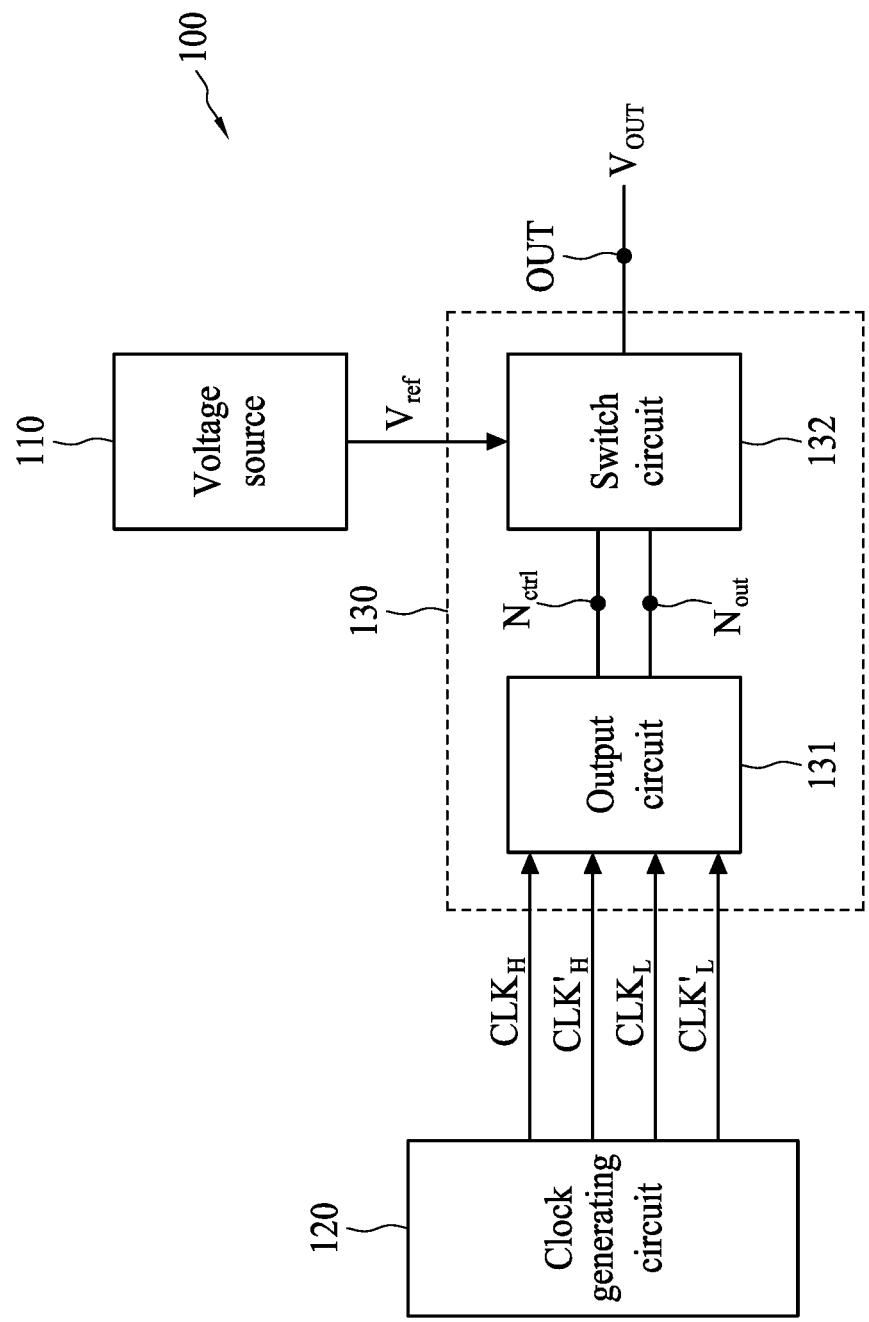
FIG. 1 is a diagram illustrating a voltage generating system according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a voltage generating system 100 according to an embodiment of the present disclosure. The voltage generating system 100 includes a voltage source 110, a clock generating circuit 120 and a voltage generating circuit 130. The voltage source 110 is arranged to provide a reference voltage $V_{ref}$ to the voltage generating circuit 130. The clock generating circuit 120 is arranged to generate clock signals $CLK_H$, $CLK'_H$, $CLK_L$ and $CLK'_L$ and provide the same to the voltage generating circuit 130. The voltage generating circuit 130 is arranged to selectively output an output signal $V_{out}$ at an output terminal OUT. Moreover, the voltage generating circuit 130 includes an output circuit 131 and a switch circuit 132. The output circuit 131 is coupled to the clock generating circuit 120 and arranged to generate a control signal CTRL at a control node $N_{ctrl}$ in response to the clock signal $CLK_H$ and the reference voltage $V_{ref}$, and further arranged to generate the output signal $V_{out}$ at an output node $N_{out}$ in response to the clock signal $CLK_L$ and the reference voltage $V_{ref}$.

Figure 2:
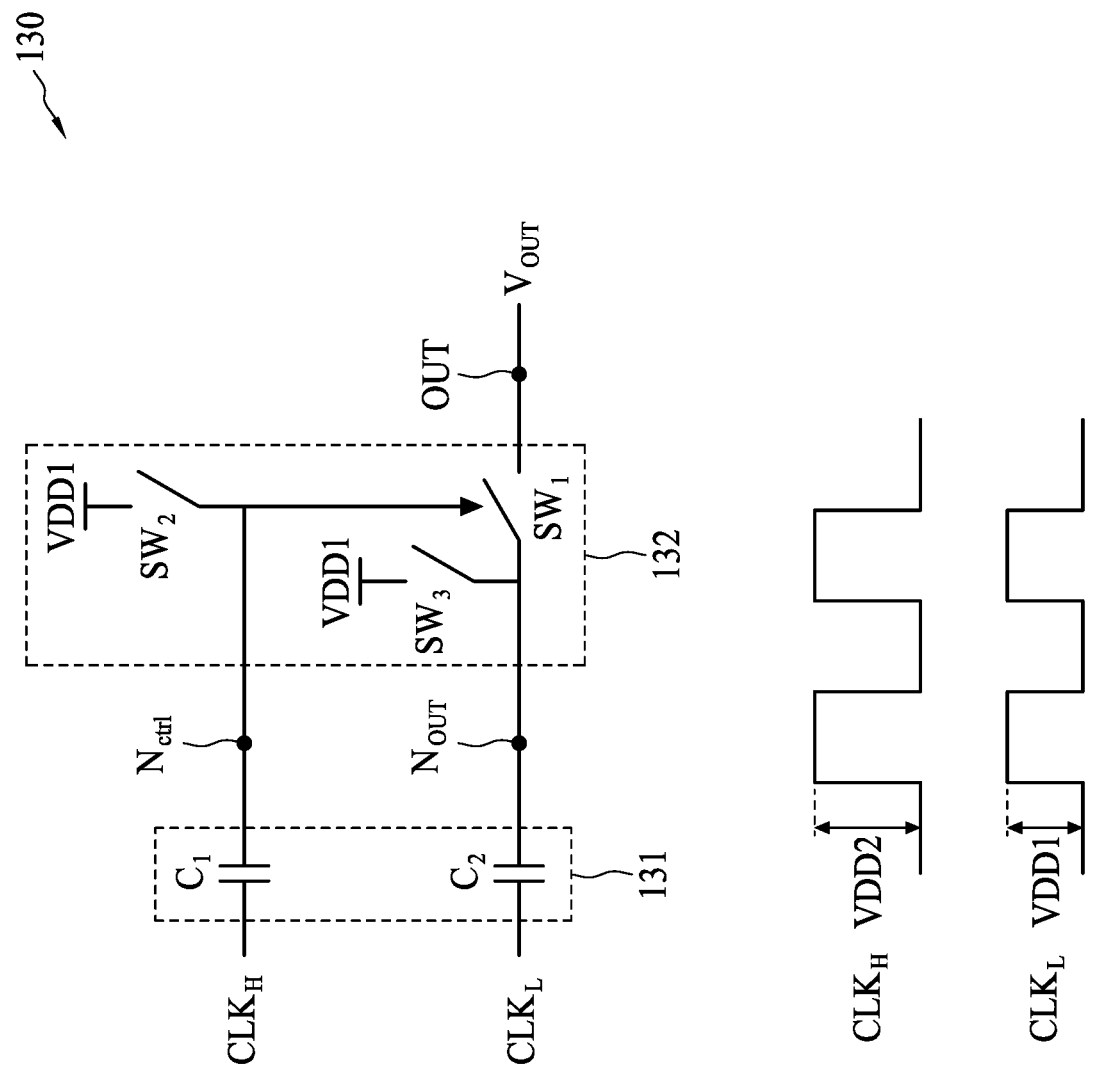
FIG. 2 is a diagram illustrating a voltage generating circuit according to an embodiment of the present disclosure.

FIG. 2 is a diagram illustrating the voltage generating circuit 130 according to an embodiment of the present disclosure. As shown in FIG. 2, the output circuit 131 includes capacitors $C_1$ and $C_2$, and the switch circuit 132 includes switches $SW_1$ to $SW_3$. In this embodiment the switch circuit 132 (and in particular, the switches $SW_2$ and $SW_3$) is coupled to a supply voltage VDD1, which is the reference voltage $V_{ref}$ from the voltage source 110. In addition, one terminal of the capacitor $C_1$ is coupled to the clock signal $CLK_H$ while the other terminal of the capacitor $C_1$ is coupled to the control node $N_{ctrl}$. One terminal of the capacitor $C_2$ is coupled to the clock signal $CLK_L$ while the other terminal of the capacitor $C_2$ is coupled to the output node $N_{out}$. A terminal of the switch $SW_1$ is coupled to the output node $N_{out}$ while another terminal of the switch $SW_1$, when activated, is coupled to the output terminal OUT. A terminal of the switch $SW_2$, when activated, is coupled to the supply voltage VDD1 while another terminal of the switch $SW_2$ is coupled to the control node $N_{ctrl}$. A terminal of the switch $SW_3$, when activated, is coupled to the supply voltage VDD1 while another terminal of the switch $SW_3$ is coupled to the output node $N_{out}$. In this embodiment, the capacitors $C_1$ and $C_2$ are identical with each other and have a capacitance greater than picoFarad (pF). However, this is not a limitation of the present disclosure.

In addition, as shown at the bottom of the FIG. 2, an amplitude of the clock signal $CLK_H$ is VDD2 while an amplitude of the clock signal $CLK_L$ is VDD1. In this embodiment, VDD2=VDD1+ΔV, where ΔV is greater than a threshold voltage of the switch SW1. The clock signals $CLK_H$ and $CLK_L$ are identical in frequency, duty cycle and phase, except in amplitude. In this embodiment, the switches $SW_2$ and $SW_3$ are controlled by an inverse of the clock signal $CLK_H$, which may be implemented by an inverter (not shown in FIG. 2). Specifically, when the clock signal $CLK_H$ is in a logic low state (e.g., the logic value '0' or a ground voltage), the switches $SW_2$ and $SW_3$ are both activated, and when the clock signal $CLK_H$ is in a logic high state (e.g., the voltage level VDD2), the switches $SW_2$ and $SW_3$ are both deactivated. The operations of the voltage generating circuit 130 will be described in detail below.

Figure 3:
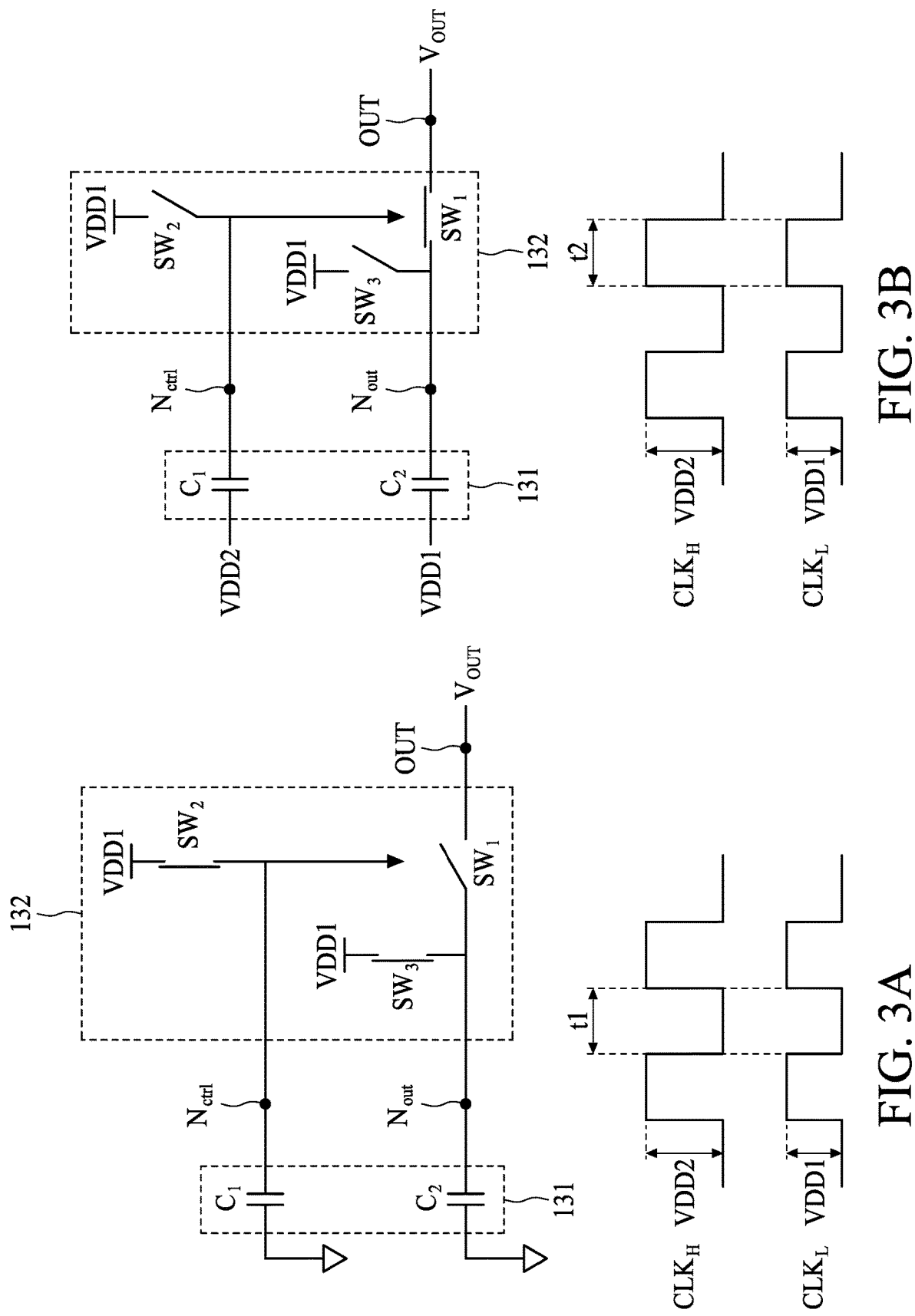
FIG. 3A and FIG. 3B are diagrams illustrating a voltage generating system operating in different modes according to an embodiment of the present disclosure.

FIG. 3A and FIG. 3B are diagrams illustrating a voltage generating circuit operating in different modes according to an embodiment of the present disclosure. In FIG. 3A, the clock signals $CLK_H$ and $CLK_L$ are both in the logic low state (e.g., the logic value '0' or the ground voltage) during the time period t1. The switches $SW_2$ and $SW_3$ are accordingly activated. With such configurations, one terminal of the capacitor $C_1$ is coupled to the ground voltage while the other terminal of the capacitor $C_1$ is coupled to the supply voltage VDD1 via the switch $SW_2$. In addition, one terminal of the capacitor $C_2$ is coupled to the ground voltage while the other terminal of the capacitor $C_2$ is coupled to the supply voltage VDD1 via the switch $SW_3$. Meanwhile, the voltage level on the control node $N_{ctrl}$ controlling the switch $SW_1$ is VDD1. As a result, the switch SW1 is kept deactivated because another terminal of the switch $SW_1$ is also coupled to the supply voltage VDD1, and the voltage difference between the control node $N_{ctrl}$ and the output node $N_{out}$, which is zero, is not large enough to activate the switch $SW_1$.

In FIG. 3B, the clock signals $CLK_H$ and $CLK_L$ are both in the logic high state (e.g., the voltage levels VDD2 and VDD1) during the time period t2. The switches $SW_2$ and $SW_3$ are accordingly deactivated. According to the law of charge conservation, when the one terminal of the capacitor $C_1$, which was coupled to the ground voltage in the time period t1, is coupled to the voltage VDD2 in the time period t2, the voltage level on the other terminal of the capacitor $C_1$, which was coupled to the supply voltage VDD1 in the time period t1, is increased to VDD2+VDD1 in the time period t2. Likewise, when the one terminal of the capacitor $C_2$, which was coupled to the ground voltage in the time period t1, is coupled to the voltage VDD1 in the time period t2, the voltage level on the other terminal of the capacitor $C_2$, which was coupled to the supply voltage VDD1 in the time period t1, is increased to 2*VDD1 in the time period t2. Because the voltage level on the control node $N_{ctrl}$ controlling the switch $SW_1$ is increased to the VDD2+VDD1 and the voltage level of the output node $N_{out}$ is 2*VDD1, the voltage difference between the control node $N_{ctrl}$ and the output node $N_{out}$ is large enough to activate the switch $SW_1$. The voltage on the output node $N_{out}$ is thus transmitted to the output terminal OUT via the switch $SW_1$. An output voltage $V_{out}$ which is twice as the supply voltage VDD1 is thus acquired at the output terminal OUT.

Figure 4:
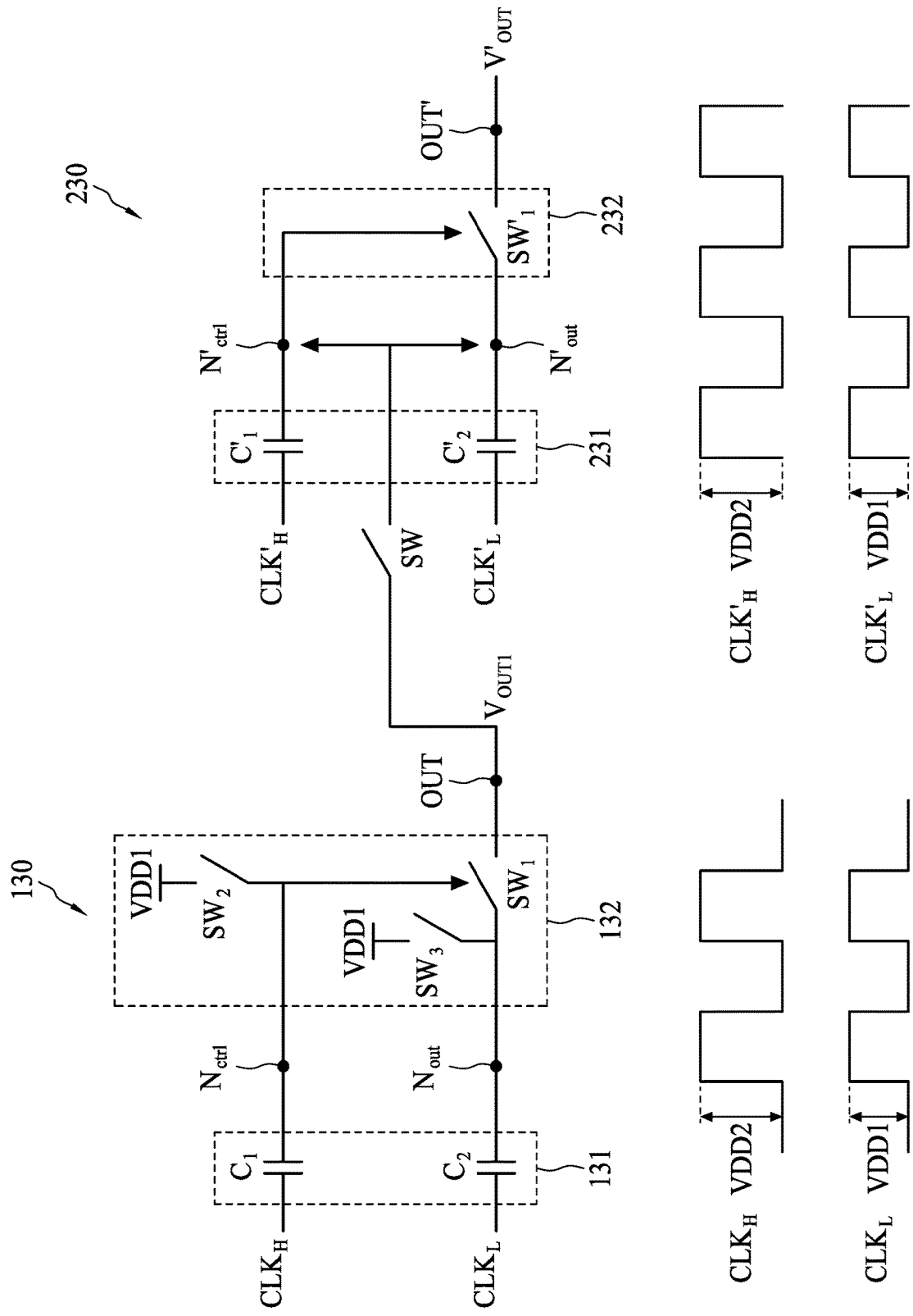
FIG. 4 is a diagram illustrating cascaded voltage generating circuits according to an embodiment of the present disclosure.

It can be easily deduced that, when more voltage generating circuits shown in FIG. 2 are cascaded, a greater positive output voltage is acquired. Refer to FIG. 4, which is a diagram illustrating the cascaded voltage generating circuits 130 and 230 according to an embodiment of the present disclosure. The voltage generating circuit 230, similar to the voltage generating circuit 130, includes a control node $N'_{ctrl}$, an output node $N'_{out}$, an output circuit 231 and a switch circuit 232. The output circuit 231 includes a capacitor $C'_1$ and a capacitor $C'_2$, and the switch circuit 232 includes a switch $SW'_1$. One terminal of the capacitor $C'_1$ is coupled to a clock signal $CLK'_H$ while the other terminal of the capacitor $C'_1$ is coupled to the control node $N'_{ctrl}$. One terminal of the capacitor $C'_2$ is coupled to a clock signal $CLK'_L$ while the other terminal of the capacitor $C'_2$ is coupled to the output node $N'_{out}$. A terminal of the switch $SW'_1$ is coupled to the output node $N'_{out}$ while another terminal of the switch $SW'_1$ is coupled to an output terminal OUT'. The output terminal OUT at the voltage generating circuit 130 is coupled via a switch SW to the control node $N'_{ctrl}$ and the output node $N'_{out}$. In this embodiment, the switch SW is controlled by the clock signal $CLK_H$. More specifically, when the clock signal $CLK_H$ is in a logic low state (e.g., the logic value '0' or a ground voltage), the switch SW is deactivated, and when the clock signal $CLK_H$ is in a logic high state (e.g., the voltage level VDD2), the switch SW is activated. Therefore, the output voltage $V_{out}$ is selectively transmitted to the voltage generating circuit 232 via the switch SW.

As shown in FIG. 4, an amplitude of the clock signal $CLK'_H$ is also VDD2 while an amplitude of the clock signal $CLK'_L$ is also VDD1. However, the phase difference between the clock signals $CLK'_H$ and $CLK_H$ is 180 degrees. Or $CLK'_H$ is an inverse of the clock signal $CLK_H$. That is, when the clock signal $CLK_H$ is in the logic low state, the clock signal $CLK'_H$ is in the logic high state. Likewise, the phase difference between the clock signals $CLK'_L$ and $CLK_L$ is also 180 degrees. Or $CLK'_L$ is an inverse of the clock signal $CLK_L$. The operation of the cascaded voltage generating circuits 130 and 230 will be described in the following paragraphs.

Figure 5A:
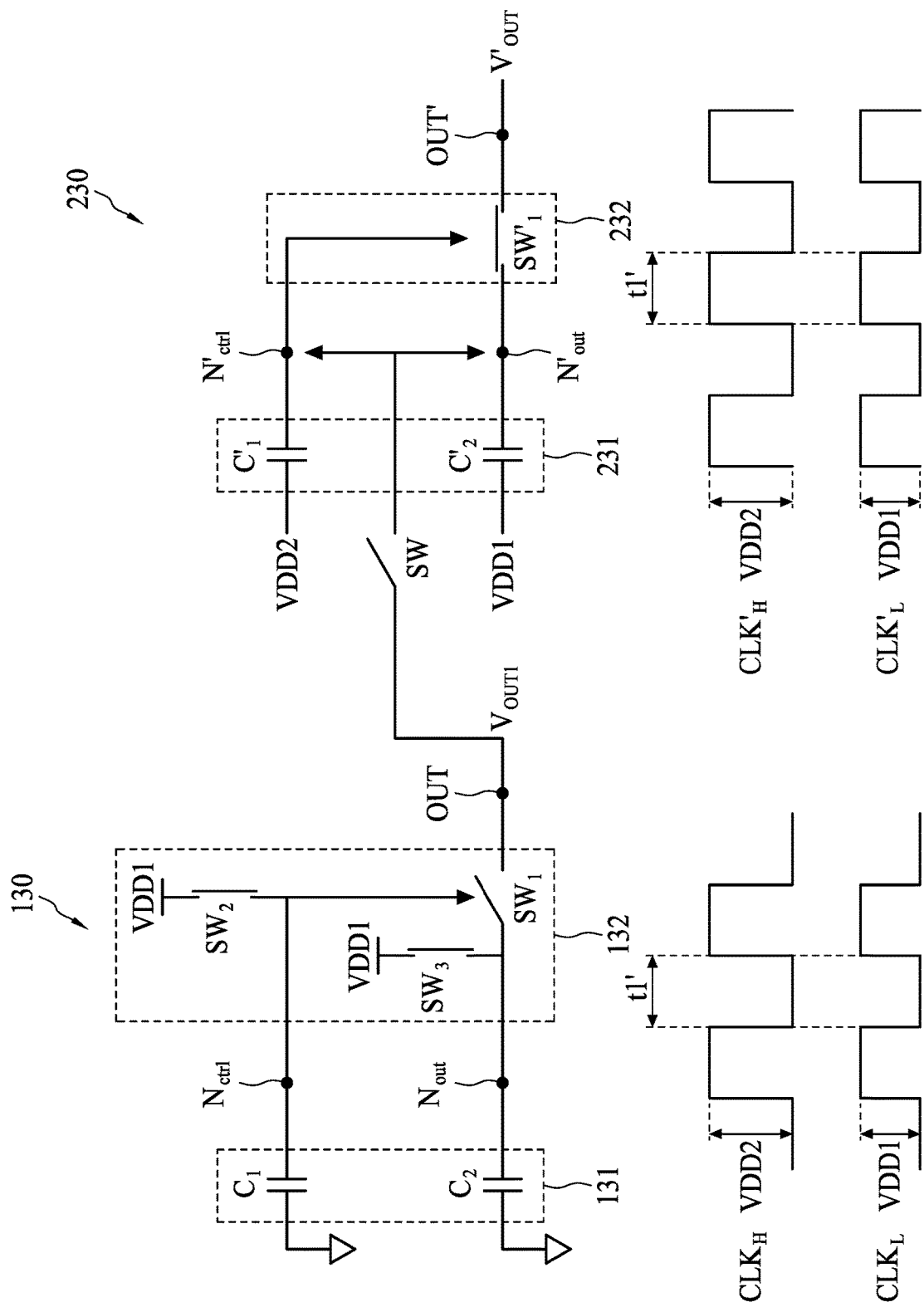
FIG. 5A to FIG. 5C are diagrams illustrating cascaded voltage generating circuits operating in different modes according to another embodiment of the present disclosure.
Figure 5B:
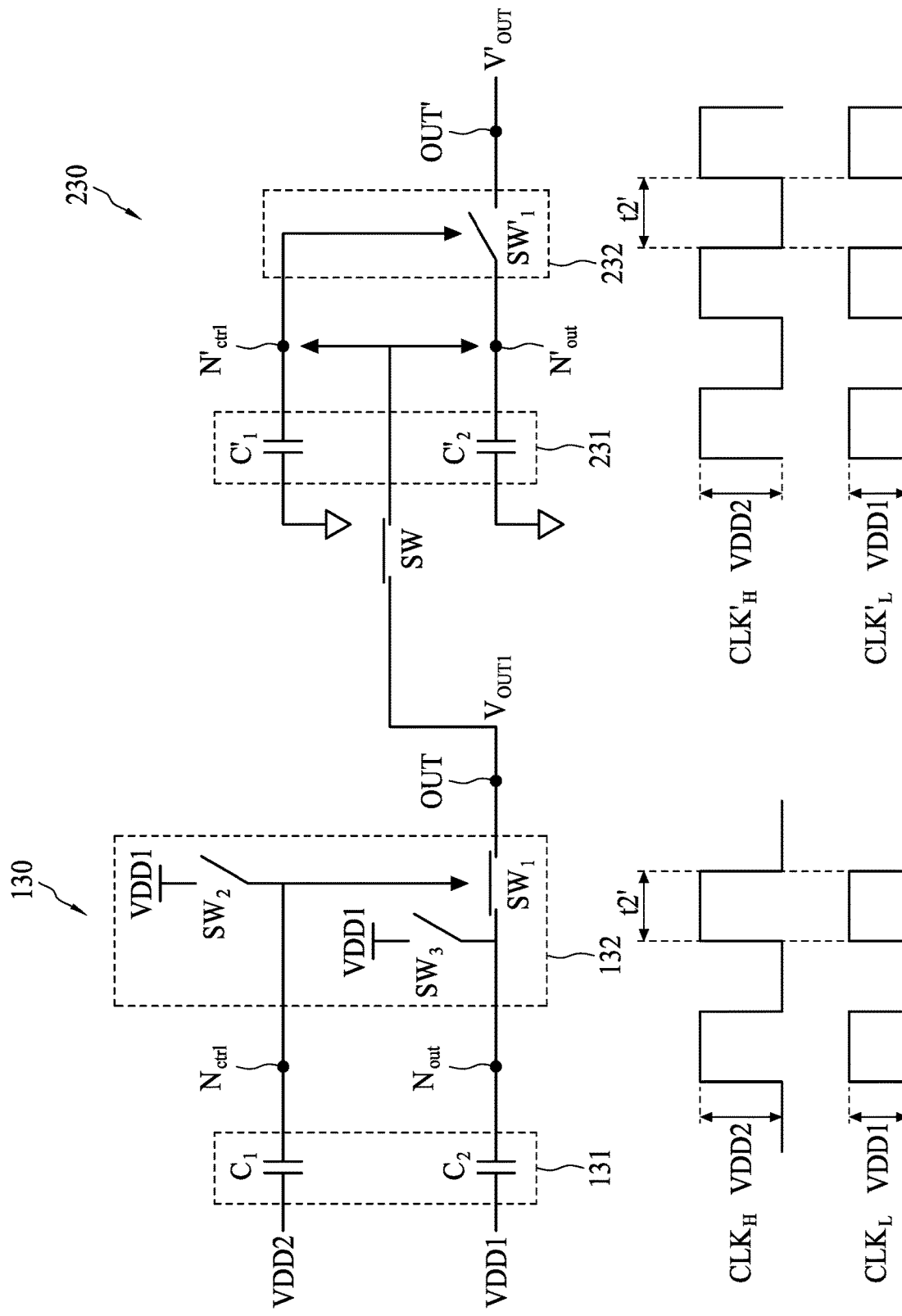
Figure 5C:
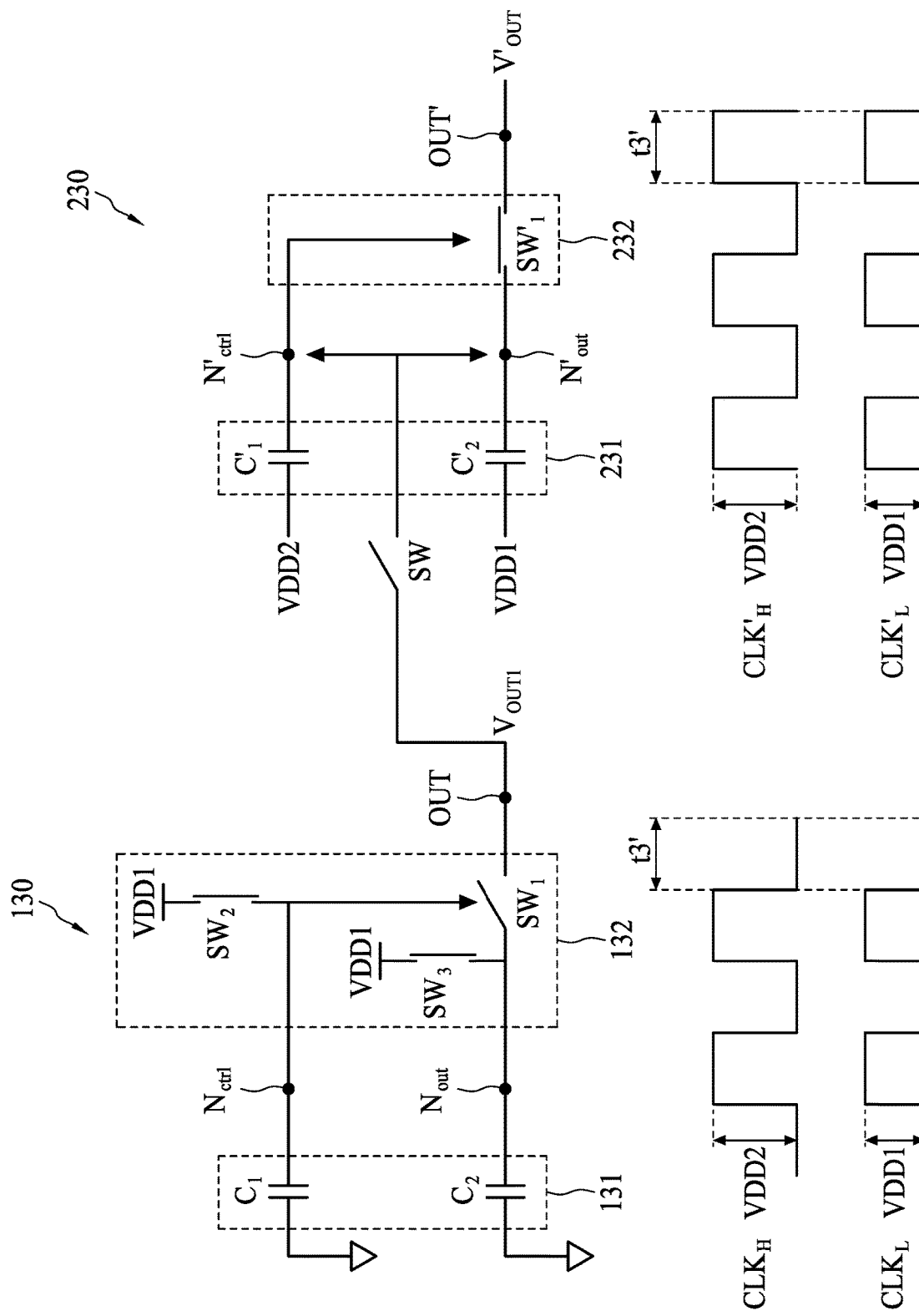

FIG. 5A to FIG. 5C are diagrams illustrating cascaded voltage generating circuits operating in different modes according to an embodiment of the present disclosure. In FIG. 5A, the clock signals $CLK_H$ and $CLK_L$ are both in the logic low state (e.g., the logic value '0' or the ground voltage) during the time period t1'. The switches $SW_2$ and $SW_3$ are accordingly activated. With such configurations, one terminal of the capacitor $C_1$ is coupled to the ground voltage while the other terminal of the capacitor $C_1$ is coupled to the supply voltage VDD1 via the switch $SW_2$. One terminal of the capacitor $C_2$ is coupled to the ground voltage while the other terminal of the capacitor $C_2$ is coupled to the supply voltage VDD1 via the switch $SW_3$. Meanwhile, the voltage level on the control node $N_{ctrl}$ controlling the switch $SW_1$ is VDD1, and the switch $SW_1$ is thus deactivated due to another terminal of the switch $SW_1$ is also coupled to the supply voltage VDD1. The switch SW is deactivated by the logic low state of the clock signal $CLK_H$. On the other hand, the clock signals $CLK'_H$ and $CLK'_L$ are both in the logic high state (e.g., the voltage levels VDD2 and VDD1) during the time period t1. With such configurations, one terminal of the capacitor $C'_1$ is coupled to the voltage level VDD2 while the other terminal of the capacitor $C'_1$ is VDD2+2*VDD1. One terminal of the capacitor $C'_2$ is coupled to the voltage level VDD1 while the other terminal of the capacitor $C'_2$ is 3*VDD1. The voltage difference between the control node $N'_{ctrl}$ and the output node $N'_{out}$ is large enough to activate the switch $SW'_1$. The voltage on the output node $N'_{out}$ is thus transmitted to the output terminal OUT' via the switch $SW'_1$. An output voltage $V'_{out}$ which is triple as the supply voltage VDD1 is thus acquired at the output terminal OUT'.

In FIG. 5B, the clock signals $CLK_H$ and $CLK_L$ are both in the logic high state (e.g., the voltages levels VDD2 and VDD1) during the time period t2'. The switches $SW_2$ and $SW_3$ are accordingly deactivated. According to the law of charge conservation, when the terminal of the capacitor $C_1$, which was coupled to the ground voltage in the time period t1', is coupled to the voltage VDD2 in the time period t2', the voltage level on the other terminal of the capacitor $C_1$, which was coupled to the supply voltage VDD1 in the time period t1', is increased to VDD2+VDD1 in the time period t2'. Likewise, when the terminal of the capacitor $C_2$, which was coupled to the ground voltage in the time period t1', is coupled to the voltage VDD1 in the time period t2', the voltage level on the other terminal of the capacitor $C_2$, which was coupled to the supply voltage VDD1 in the time period t1', is increased to 2*VDD1 in the time period t2'. Because the voltage level on the control node $N_{ctrl}$ controlling the switch $SW_1$ is increased to the VDD2+VDD1 and the voltage level of the output node $N_{out}$ is 2*VDD1, the voltage level between the control node $N_{ctrl}$ and the output node $N_{out}$ is large enough to activate the switch $SW_1$. The voltage on the output node $N_{out}$ is thus transmitted to the output terminal OUT via the switch $SW_1$. An output voltage $V_{out}$ which is twice as the supply voltage VDD1 is thus acquired at the output terminal OUT. In the time period t2', the switch SW is activated by the logic high state of the clock signal $CLK_H$. The output voltage $V_{out}$ is thus transmitted to the control node $N'_{ctrl}$ and the output node $N'_{out}$. On the other hand, one terminal of the capacitor $C'_1$ is coupled to the ground voltage while the other terminal of the capacitor $C'_1$ is coupled to the supply voltage 2*VDD1 from the output terminal OUT. One terminal of the capacitor $C'_2$ is coupled to the ground voltage while the other terminal of the capacitor $C'_2$ is coupled to the supply voltage 2*VDD1 from the output terminal OUT. Meanwhile, the voltage level on the control node $N_{ctrl}$ controlling the switch $SW'_1$ is 2*VDD1, and the switch $SW'_1$ is thus deactivated due to another terminal of the switch is also coupled to 2*VDD1.

In FIG. 5C, the clock signals $CLK'_H$ and $CLK'_L$ are both in the logic high state (e.g., the voltages levels VDD2 and VDD1) during the time period t3'. According to the law of charge conservation, when the terminal of the capacitor $C'_1$, which was coupled to the ground voltage in the time period t2', is coupled to the voltage VDD2 in the time period t3', the voltage level on the other terminal of the capacitor $C'_1$, which was coupled to the supply voltage 2*VDD1 in the time period t2', is increased to VDD2+2*VDD1 in the time period t3'. Likewise, when the terminal of the capacitor $C'_2$, which was coupled to the ground voltage in the time period t2', is coupled to the voltage VDD1 in the time period t3', the voltage level on the other terminal of the capacitor $C'_2$, which was coupled to the supply voltage 2*VDD1 in the time period t2', is increased to 3*VDD1 in the time period t3'. Because the voltage level on the control node $N'_{ctrl}$ controlling the switch $SW_1$ is increased to the VDD2+2*VDD1 and the voltage level of the output node $N'_{out}$ is 3*VDD1, the voltage level between the control node $N'_{ctrl}$ and the output node $N'_{out}$ is large enough to activate the switch $SW'_1$. The voltage on the output node $N'_{out}$ is thus transmitted to the output terminal OUT' via the switch $SW'_1$. An output voltage $V'_{out}$ which is three times the supply voltage VDD1 is thus acquired at the output terminal OUT'.

Figure 6:
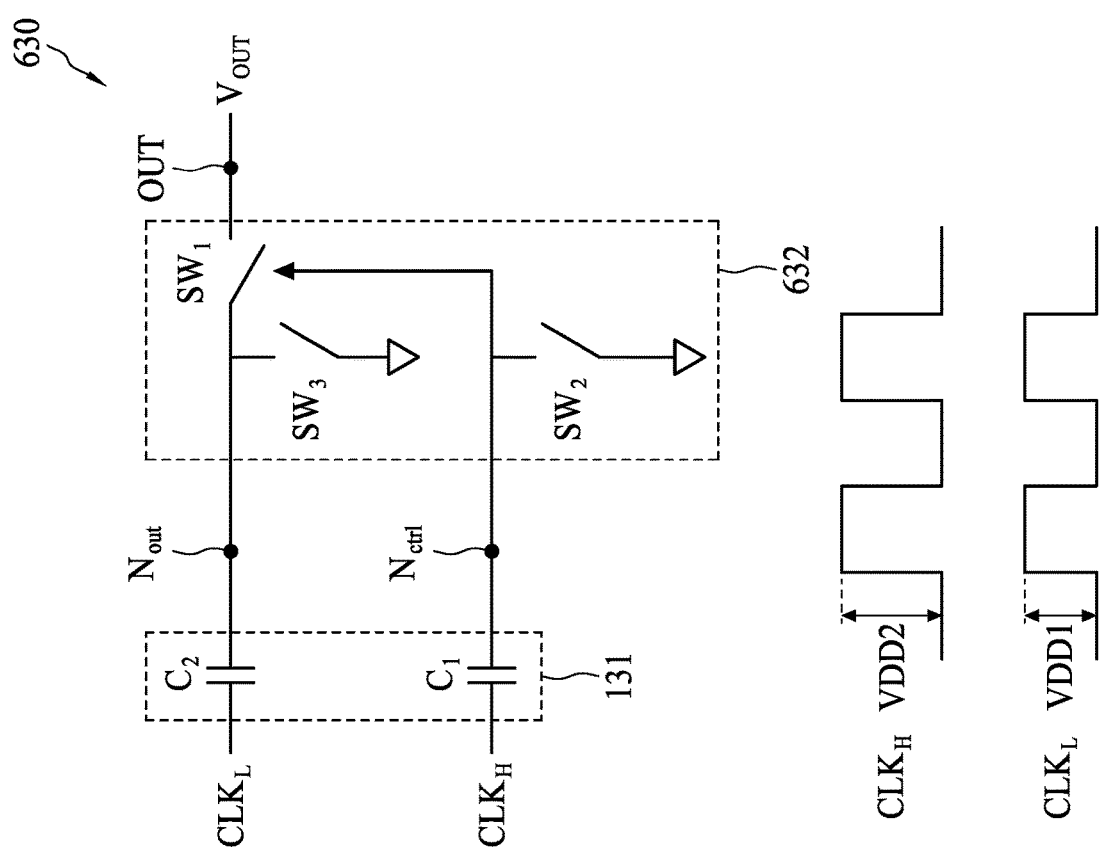
FIG. 6 is a diagram illustrating a voltage generating circuit according to another embodiment of the present disclosure.

FIG. 6 is a diagram illustrating a voltage generating circuit 630 according to another embodiment of the present disclosure. Referring to FIG. 6, the voltage generating circuit 630 is similar to the voltage generating circuit 130 described and illustrated with reference to FIG. 2 except a switch circuit 632. The voltage generating circuit 630 may be adapted to implement the voltage generating circuit 130 shown in FIG. 1. The switch circuit 632 includes switches $SW_1$ to $SW_3$. In this embodiment the switch circuit 632 (and in particular, the switch $SW_2$ and $SW_3$) coupled to a ground voltage which is the reference voltage $V_{ref}$ from the voltage source 110. In addition, one terminal of the capacitor $C_1$ is coupled to the clock signal $CLK_H$ while the other terminal of the capacitor $C_1$ is coupled to the control node $N_{ctrl}$. One terminal of the capacitor $C_2$ is coupled to the clock signal $CLK_L$ while the other terminal of the capacitor $C_2$ is coupled to the output node $N_{out}$. A terminal of the switch $SW_1$ is coupled to the output node $N_{out}$ while another terminal of the switch $SW_1$ is coupled to the output terminal OUT. A terminal of the switch $SW_2$ is coupled to the ground voltage while another terminal of the switch $SW_2$ is coupled to the control node $N_{ctrl}$. A terminal of the switch $SW_3$ is coupled to the ground voltage while another terminal of the switch $SW_3$ is coupled to the output node $N_{out}$. In this embodiment, the capacitor s $C_1$ and $C_2$ are identical with each other and have a capacitance greater than picoFarad (pF). However, this is not a limitation of the present disclosure.

In addition, as shown at the bottom of the FIG. 6, an amplitude of the clock signal $CLK_H$ is VDD2 while an amplitude of the clock signal $CLK_L$ is VDD1. In this embodiment, VDD2=VDD1+ΔV, where ΔV is greater than a threshold voltage of the switch $SW_1$, the clock signal $CLK_H$ and $CLK_L$ are identical in frequency, duty cycle, and phase, except in the amplitude. In this embodiment, the switches $SW_2$ and $SW_3$ are controlled by the clock signal $CLK_H$. Specifically, when the clock signal $CLK_H$ is in a logic low state (e.g., the logic value '0' or a ground voltage), the switches $SW_2$ and $SW_3$ are both deactivated, and when the clock signal $CLK_H$ is in a logic high state (e.g., the voltage level VDD2), the switches $SW_2$ and $SW_3$ are both activated. The operations of the voltage generating circuit 630 will be described in detail below.

Figure 7A:
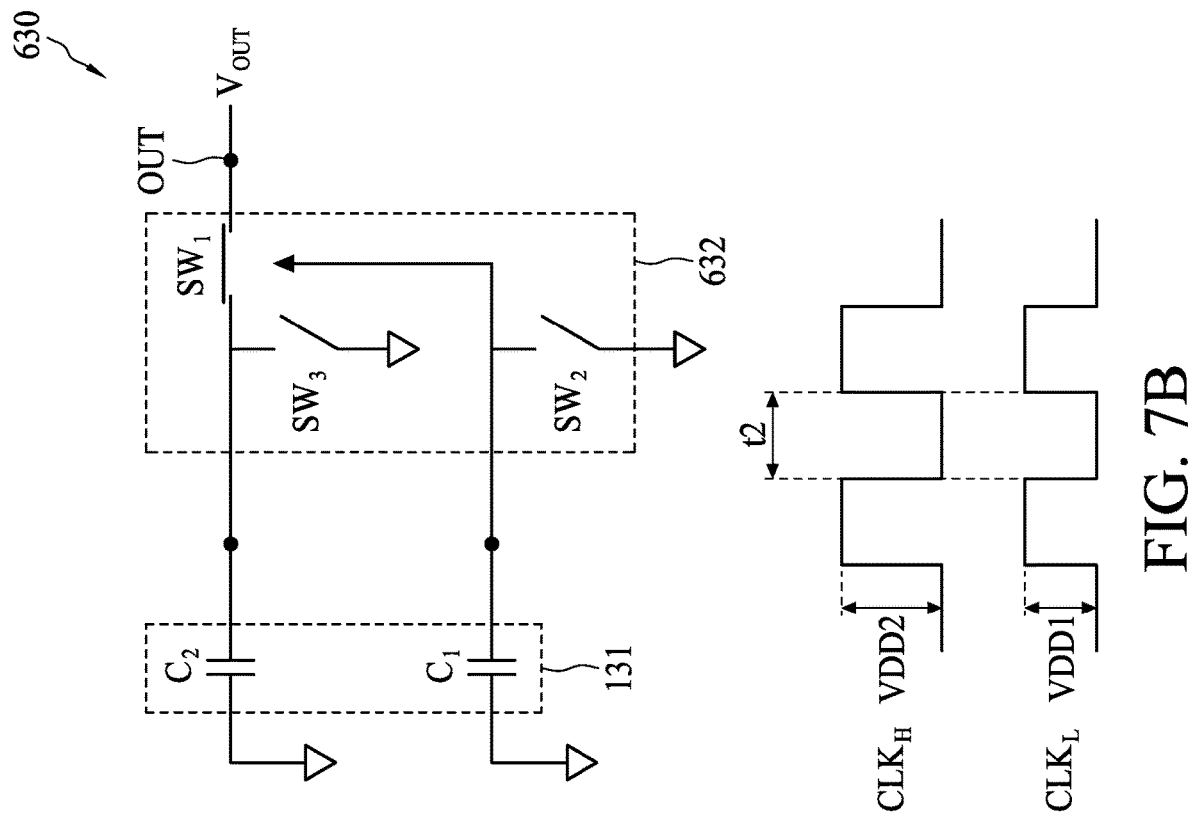
FIG. 7A and FIG. 7B are diagrams illustrating a voltage generating system operating in different modes according to another embodiment of the present disclosure.
Figure 7B:
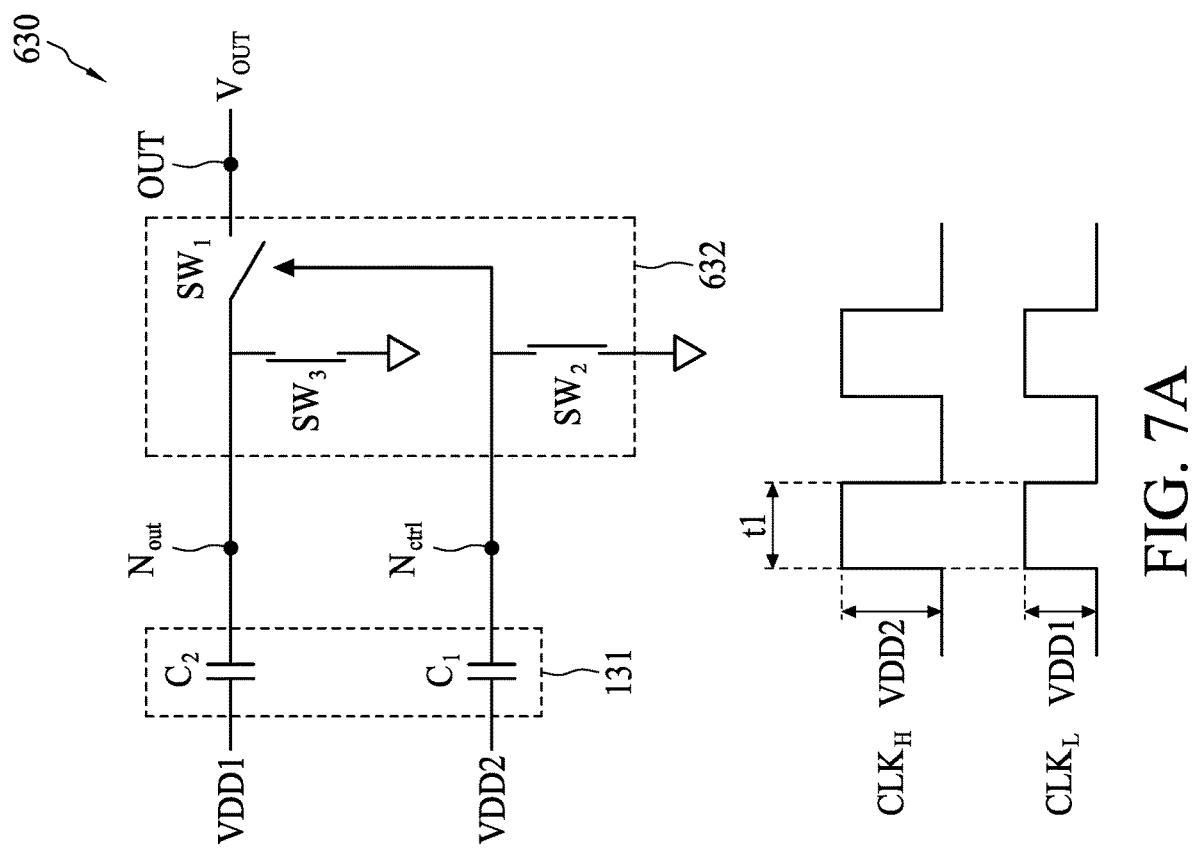

FIG. 7A and FIG. 7B are diagrams illustrating a voltage generating circuit operating in different modes according to an embodiment of the present disclosure. In FIG. 7A, the clock signals $CLK_H$ and $CLK_L$ are both in the logic high state (e.g., the voltage levels VDD2 and VDD1) during the time period t1. The switches $SW_2$ and $SW_3$ are accordingly activated. With such configurations, one terminal of the capacitor $C_1$ is coupled to the voltage level VDD2 while the other terminal of the capacitor $C_1$ is coupled to the ground voltage via the switch $SW_2$. In addition, one terminal of the capacitor $C_2$ is coupled to the voltage level VDD1 while the other terminal of the capacitor $C_2$ is coupled to the ground voltage via the switch $SW_3$. Meanwhile, the voltage level on the control node $N_{ctrl}$ controlling the switch $SW_1$ is the ground voltage. As a result, the switch SW1 is kept deactivated because another terminal of the switch $SW_1$ is also coupled to the ground voltage, and the voltage difference between the control node $N_{ctrl}$ and the output node $N_{out}$, which is zero, is not large enough to activate the switch $SW_1$.

In FIG. 7B, the clock signals $CLK_H$ and $CLK_L$ are both in the logic low state (e.g., the ground voltage) during the time period t2. The switches $SW_2$ and $SW_3$ are accordingly deactivated. According to the law of charge conservation, when the one terminal of the capacitor $C_1$, which was coupled to the voltage level VDD2 in the time period t1, is coupled to the ground voltage in the time period t2, the voltage level on the other terminal of the capacitor $C_1$, which was coupled to the ground voltage in the time period t1, is decreased to −VDD2 in the time period t2. Likewise, when the one terminal of the capacitor $C_2$, which was coupled to the voltage level VDD1 in the time period t1, is coupled to the ground voltage in the time period t2, the voltage level on the other terminal of the capacitor $C_2$, which was coupled to the ground voltage in the time period t1, is decreased to −VDD1 in the time period t2. Because the voltage level on the control node $N_{ctrl}$ controlling the switch $SW_1$ is decreased to the −VDD2 and the voltage level of the output node $N_{out}$ is −VDD1, the voltage difference between the control node $N_{ctrl}$ and the output node $N_{out}$ is large enough to activate the switch $SW_1$. The voltage on the output node $N_{out}$ is thus transmitted to the output terminal OUT via the switch $SW_1$. An output voltage $V_{out}$ which is −VDD1 is thus acquired at the output terminal OUT. It can be easily deduced that, when more voltage generating circuits shown in FIG. 6 are cascaded, a greater negative output voltage is acquired. Those skilled in the art should readily understand the implementation of the cascaded voltage generating circuits for generating a negative output voltage after reading the embodiments of FIGS. 5A to 5C. The detailed description is omitted here for brevity.

FIG. 8 is a diagram illustrating a voltage generating circuit 830 according to another embodiment of the present disclosure. The voltage generating circuit 830 may be adapted to implement the voltage generating circuit 130 shown in FIG. 1. In this embodiment, the output circuit 131 includes capacitors $C_1$, $C_2$, $C'_1$ and $C'_2$, and the switch circuit 132 includes switches $SW_1$ to $SW_3$ and $SW'_1$ to $SW'_3$. In this embodiment, the switch circuit (and in particular, the switch $SW_2$, $SW'_2$, $SW_3$ and $SW'_3$) coupled to a supply voltage VDD1 which is the reference voltage $V_{ref}$ from the voltage source 110. In addition, one terminal of the capacitor $C_1$ is coupled to the clock signal $CLK_H$ while the other terminal of the capacitor $C_1$ is coupled to the control node $N_{ctrl}$. One terminal of the capacitor $C_2$ is coupled to the clock signal $CLK_L$ while the other terminal of the capacitor $C_2$ is coupled to the output node $N_{out}$. A terminal of the switch $SW_1$ is coupled to the output node $N_{out}$ while another terminal of the switch $SW_1$ is coupled to the output terminal OUT. A terminal of the switch $SW_2$ is coupled to the supply voltage VDD1 while another terminal of the switch $SW_2$ is coupled to the control node $N_{ctrl}$. A terminal of the switch $SW_3$ is coupled to the supply voltage VDD1 while another terminal of the switch $SW_3$ is coupled to the output node $N_{out}$.

On the other hand, one terminal of the capacitor $C'_1$ is coupled to the clock signal $CLK'_H$ while the other terminal of the capacitor $C'_1$ is coupled to the control node $N'_{ctrl}$. One terminal of the capacitor $C'_2$ is coupled to the clock signal $CLK'_L$ while the other terminal of the capacitor $C'_2$ is coupled to the output node $N'_{out}$. A terminal of the switch $SW'_1$ is coupled to the output node $N'_{out}$ while another terminal of the switch $SW'_1$ is coupled to the output terminal OUT. A terminal of the switch $SW'_2$ is coupled to the supply voltage VDD1 while another terminal of the switch $SW'_2$ is coupled to the control node $N'_{ctrl}$. A terminal of the switch $SW'_3$ is coupled to the supply voltage VDD1 while another terminal of the switch $SW'_3$ is coupled to the output node $N'_{out}$. In this embodiment, the capacitors $C_1$, $C_2$, $C'_1$, and $C'_2$ are identical with each other and have a capacitance greater than picoFarad (pF). However, this is not a limitation of the present disclosure.

As shown in the bottom of the FIG. 8, an amplitude of the clock signal $CLK_H$ is VDD2 while an amplitude of the clock signal $CLK_L$ is VDD1. In this embodiment, VDD2=VDD1+ΔV, where ΔV is greater than a threshold voltage of the switch SW1. The clock signal $CLK_H$ and $CLK_L$ are identical in frequency, duty cycle, and phase, except in the amplitude. The clock signals $CLK'_H$ and $CLK'_L$ are identical with those shown in FIG. 4, that is, the phase difference between the clock signals $CLK'_H$ and $CLK_H$ is 180 degrees. When the clock signal $CLK_H$ is in the logic low state, the clock signal $CLK'_H$ is in the logic high state. Likewise, the phase difference between the clock signals $CLK'_L$ and $CLK_L$ is also 180 degrees.

In this embodiment, the switches $SW_2$ and $SW_3$ are controlled by $CLK'_H$, an inverse of the clock signal $CLK_H$ which may be implemented by an inverter (not shown in FIG. 8), while the switches $SW'_2$ and $SW'_3$ are controlled by $CLK_H$, an inverse of the clock signal $CLK'_H$. Specifically, when the clock signal $CLK_H$ is in a logic low state (e.g., the logic value '0' or a ground voltage), the switches $SW_2$ and $SW_3$ are both activated, and when the clock signal $CLK_H$ is in a logic high state (e.g., the voltage level VDD2), the switches $SW_2$ and $SW_3$ are both deactivated. When the clock signal $CLK'_H$ is in a logic low state (e.g., the logic value '0' or a ground voltage), the switches SW'$_2$ and SW'$_3$ are both activated, and when the clock signal CLK'$_H$ is in a logic high state (e.g., the voltage level VDD2), the switches SW'$_2$ and SW'$_3$ are both deactivated. The operations of the voltage generating circuit 130 shown in FIG. 8 will be described in detail below.

Figure 9A:
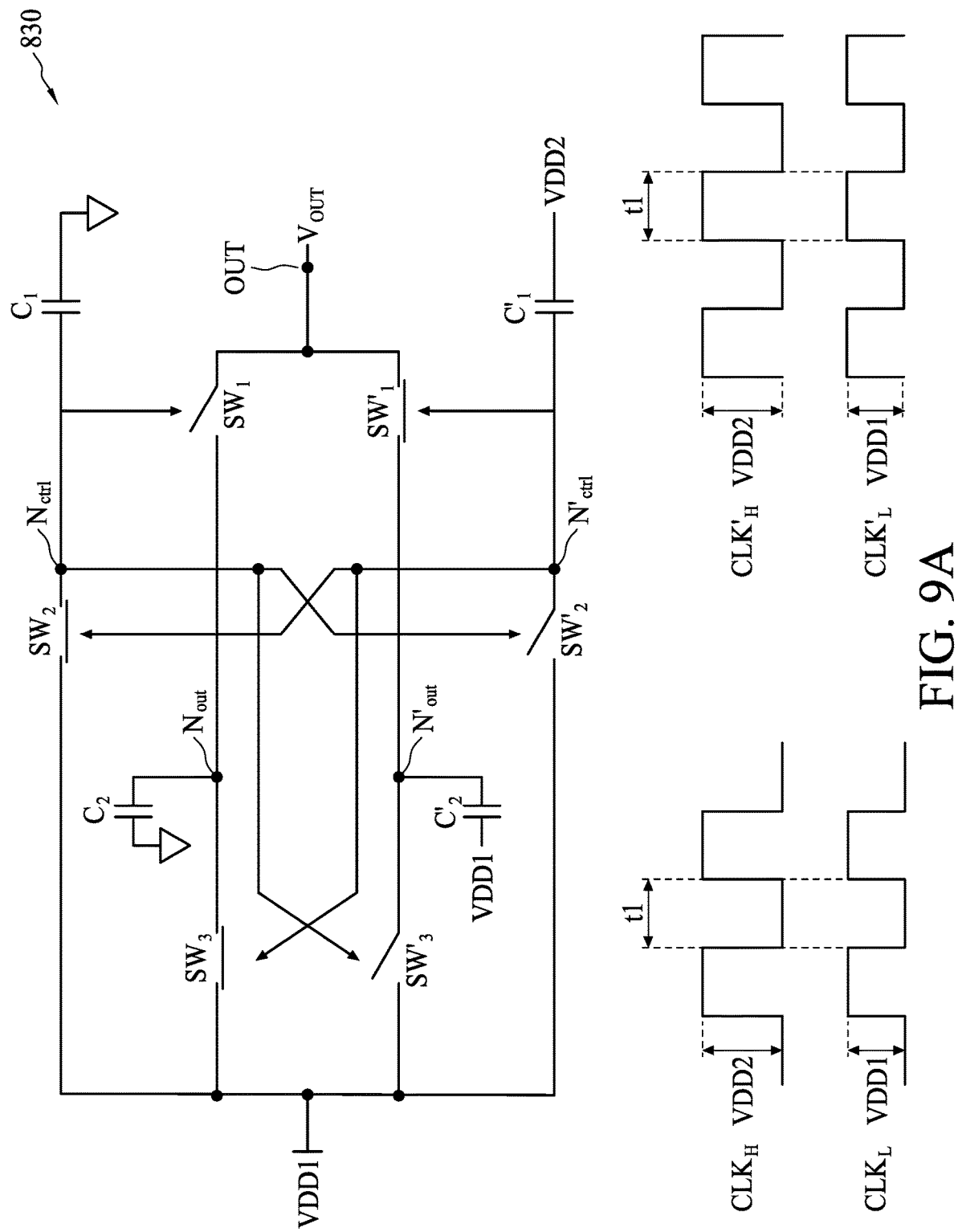
FIG. 9A to FIG. 9C are diagrams illustrating a voltage generating system operating in different modes according to another embodiment of the present disclosure.
Figure 9B:
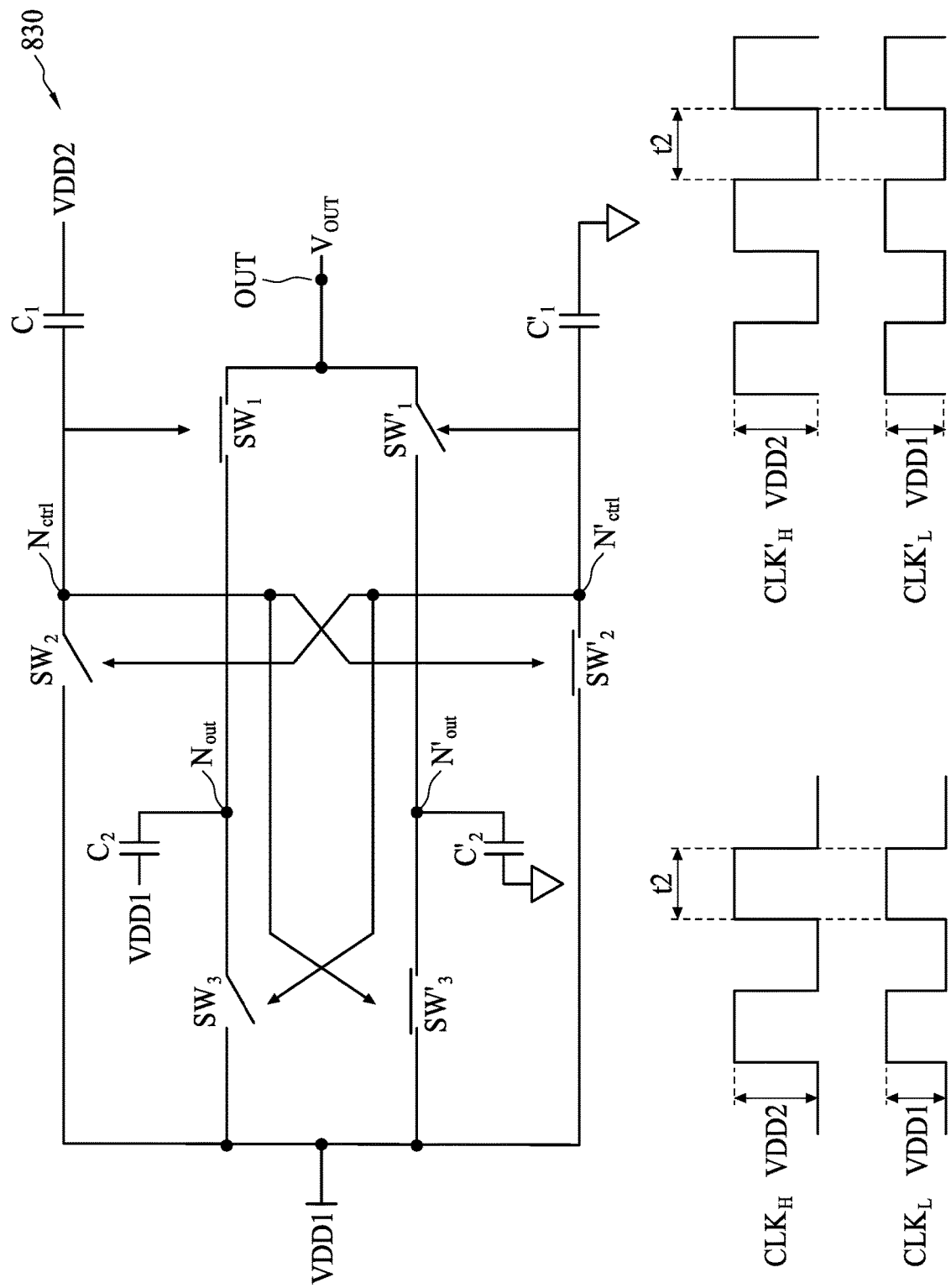
Figure 9C:
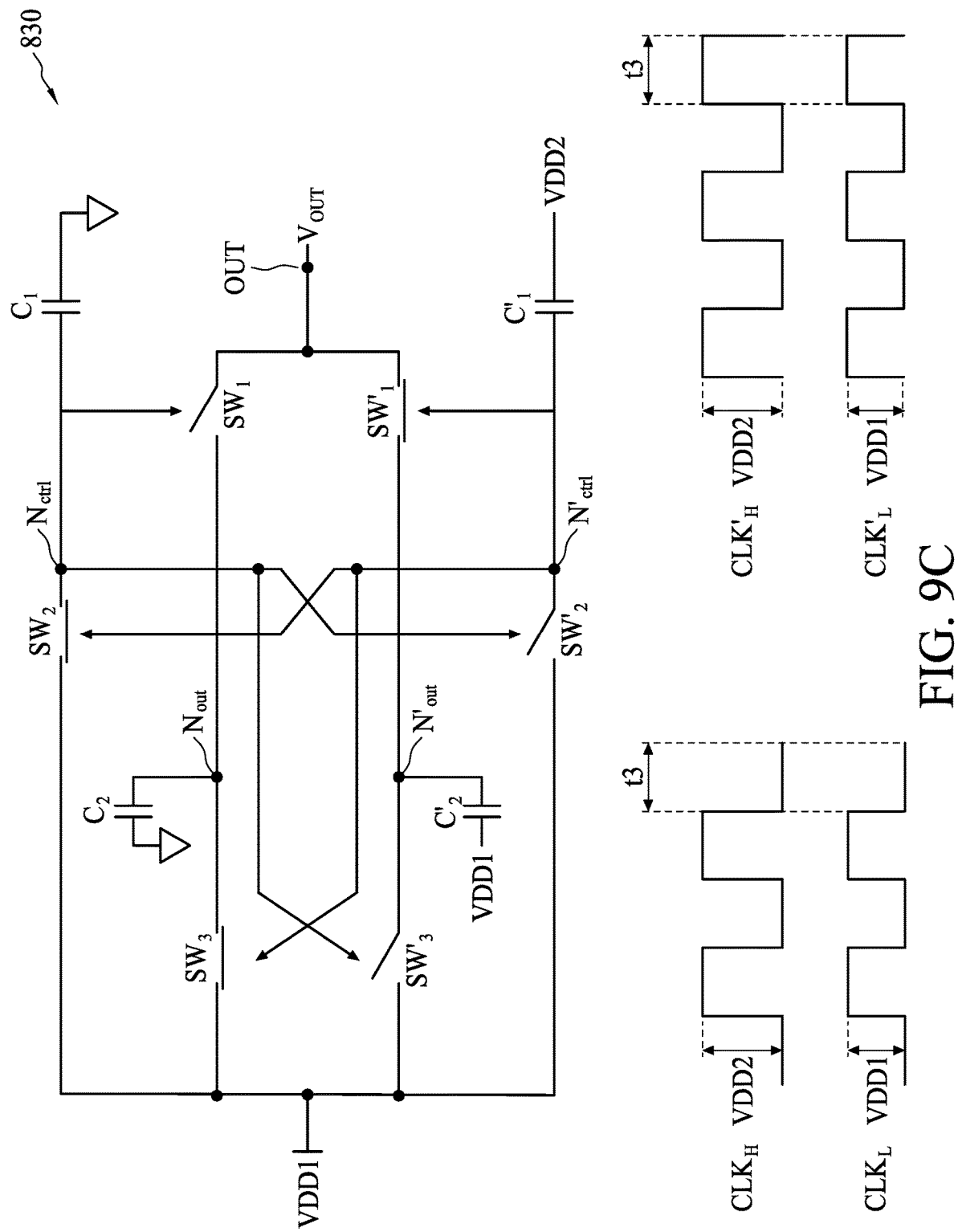

FIG. 9A and FIG. 9C are diagrams illustrating a voltage generating circuit operating in different modes according to an embodiment of the present disclosure. In FIG. 9A, the clock signals CLK$_H$ and CLK$_L$ are both in the logic low state (e.g., the logic value '0' or the ground voltage) during the time period t1. The switches SW$_2$ and SW$_3$ are accordingly activated. With such configurations, one terminal of the capacitor C$_1$ is coupled to the ground voltage while the other terminal of the capacitor C$_1$ is coupled to the supply voltage VDD1 via the switch SW$_2$. One terminal of the capacitor C$_2$ is coupled to the ground voltage while the other terminal of the capacitor C$_2$ is coupled to the supply voltage VDD1 via the switch SW$_3$. Meanwhile, the voltage level on the control node N$_{ctrl}$ controlling the switch SW$_1$ is VDD1. As a result, the switch SW1 is kept deactivated because another terminal of the switch SW$_1$ is also coupled to the supply voltage VDD1, and the voltage difference between the control node N$_{ctrl}$ and the output node N$_{out}$, which is zero, is not large enough to activate the switch SW$_1$.

In FIG. 9B, the clock signals CLK$_H$ and CLK$_L$ are both in the logic high state (e.g., the voltage levels VDD2 and VDD1) during the time period t2. The switches SW$_2$ and SW$_3$ are accordingly deactivated. According to the law of charge conservation, when the terminal of the capacitor C$_1$, which was coupled to the ground voltage in the time period t1, is coupled to the voltage VDD2 in the time period t2, the voltage level on the other terminal of the capacitor C$_1$, which was coupled to the supply voltage VDD1 in the time period t1, is increased to VDD2+VDD1 in the time period t2. Likewise, when the terminal of the capacitor C$_2$, which was coupled to the ground voltage in the time period t1, is coupled to the voltage VDD1 in the time period t2, the voltage level on the other terminal of the capacitor C$_2$, which was coupled to the supply voltage VDD1 in the time period t1, is increased to 2*VDD1 in the time period t2. Because the voltage level on the control node N$_{ctrl}$ controlling the switch SW$_1$ is increased to the VDD2+VDD1 and the voltage level of the output node N$_{out}$ is 2*VDD1, the voltage difference between the control node N$_{ctrl}$ and the output node N$_{out}$ is large enough to activate the switch SW$_1$. The voltage on the output node N$_{out}$ is thus transmitted to the output terminal OUT via the switch SW$_1$. An output voltage V$_{out}$ which is twice as the supply voltage VDD1 is thus acquired at the output terminal OUT.

Meanwhile, the clock signals CLK'$_H$ and CLK'$_L$ are both in the logic low state (e.g., the logic value '0' or the ground voltage) during the time period t2. The switches SW'$_2$ and SW'$_3$ are accordingly activated. With such configurations, one terminal of the capacitor C'$_1$ is coupled to the ground voltage while the other terminal of the capacitor C'$_1$ is coupled to the supply voltage VDD1 via the switch SW'$_2$. One terminal of the capacitor C'$_2$ is coupled to the ground voltage while the other terminal of the capacitor C'$_2$ is coupled to the supply voltage VDD1 via the switch SW'$_3$. Meanwhile, the voltage level on the control node N'$_{ctrl}$ controlling the switch SW'$_1$ is VDD1, and the switch SW'$_1$ is thus deactivated due to one terminal of the switch is also coupled to the supply voltage VDD1.

In FIG. 9C, the clock signals CLK'$_H$ and CLK'$_L$ are both in the logic high state (e.g., the voltage levels VDD2 and VDD1) during the time period t3. The switches SW'$_2$ and SW'$_3$ are accordingly deactivated. According to the law of charge conservation, when the terminal of the capacitor C'$_1$, which was coupled to the ground voltage in the time period t2, is coupled to the voltage VDD2 in the time period t3, the voltage level on the other terminal of the capacitor C'$_1$, which was coupled to the supply voltage VDD1 in the time period t2, is increased to VDD2+VDD1 in the time period t3. Likewise, when the terminal of the capacitor C'$_2$, which was coupled to the ground voltage in the time period t2, is coupled to the voltage VDD1 in the time period t3, the voltage level on the other terminal of the capacitor C'$_2$, which was coupled to the supply voltage VDD1 in the time period t2, is increased to 2*VDD1 in the time period t3. Because the voltage level on the control node N'$_{ctrl}$ controlling the switch SW'$_1$ is increased to the VDD2+VDD1 and the voltage level of the output node N'$_{out}$ is 2*VDD1, the voltage difference between the control node N'$_{ctrl}$ and the output node N'$_{out}$ is large enough to activate the switch SW'$_1$. The voltage on the output node N'$_{out}$ is thus transmitted to the output terminal OUT via the switch SW'$_1$. The output voltage V$_{out}$ which is twice as the supply voltage VDD1 is thus acquired at the output terminal OUT. Therefore, when the voltage generating circuit 830 is adapted, the output voltage V$_{out}$ which is twice as the supply voltage VDD1 can be acquired at the output terminal in every time period.

FIG. 10 is a diagram illustrating a voltage generating circuit 1030 according to another embodiment of the present disclosure. The voltage generating circuit 1030 may be adapted to implement the voltage generating circuit 130 shown in FIG. 1. In this embodiment, the output circuit 131 includes capacitors C$_1$ to C$_2$ and C'$_1$ to C'$_2$, and the switch circuit 132 includes switches SW$_1$ to SW$_3$ and SW'$_1$ to SW'$_3$. In this embodiment the switch circuit (and in particular, the switch SW$_2$, SW'$_2$, SW$_3$ and SW'$_3$) coupled to a ground voltage which can be regarded as the reference voltage V$_{ref}$ from the voltage source 110. In addition, one terminal of the capacitor C$_1$ is coupled to the clock signal CLK$_H$ while the other terminal of the capacitor C$_1$ is coupled to the control node N$_{ctrl}$. One terminal of the capacitor C$_2$ is coupled to the clock signal CLK$_L$ while the other terminal of the capacitor C$_2$ is coupled to the output node N$_{out}$. One terminal of the switch SW$_1$ is coupled to the output node N$_{out}$ while another terminal of the switch SW$_1$ is coupled to the output terminal OUT. A terminal of the switch SW$_2$ is coupled to the ground voltage while another terminal of the switch SW$_2$ is coupled to the control node N$_{ctrl}$. A terminal of the switch SW$_3$ is coupled to the ground voltage while another terminal of the switch SW$_3$ is coupled to the output node N$_{out}$.

On the other hand, one terminal of the capacitor C'$_1$ is coupled to the clock signal CLK'$_H$ while the other terminal of the capacitor C'$_1$ is coupled to the control node N'$_{ctrl}$. One of the capacitor C'$_2$ is coupled to the clock signal CLK'$_L$ while the other terminal of the capacitor C'$_2$ is coupled to the output node N'$_{out}$. A terminal of the switch SW'$_1$ is coupled to the output node N'$_{out}$ while another terminal of the switch SW'$_1$ is coupled to the output terminal OUT. A terminal of the switch SW'$_2$ is coupled to the ground voltage while another terminal of the switch SW'$_2$ is coupled to the control node N'$_{ctrl}$. A terminal of the switch SW'$_3$ is coupled to the ground voltage while another terminal of the switch SW'$_3$ is coupled to the output node N'$_{out}$. In this embodiment, the capacitors C$_1$, C$_2$, C'$_1$, and C'$_2$ are identical with each other and have a capacitance greater than picoFarad (pF). However, this is not a limitation of the present disclosure.

As shown in the bottom of the FIG. 10, an amplitude of the clock signal CLK$_H$ is VDD2 while an amplitude of the clock signal CLK$_L$ is VDD1. In this embodiment, VDD2=VDD1+ΔV, where ΔV is greater than a threshold voltage of the switch SW1. The clock signal CLK$_H$ and CLK$_L$ are identical in frequency, duty cycle, and phase, except in the amplitude. The clock signals CLK'$_H$ and CLK'$_L$ are identical with those shown in FIG. 4, that is, the phase difference between the clock signals CLK'$_H$ and CLK$_H$ is 180 degrees. When the clock signal CLK$_H$ is in the logic low state, the clock signal CLK'$_H$ is in the logic high state. Likewise, the phase difference between the clock signals CLK'$_L$ and CLK$_L$ is also 180 degrees.

In this embodiment, the switches SW$_2$ and SW$_3$ are controlled by the clock signal CLK'$_H$, while the switches SW'$_2$ and SW'$_3$ are controlled by the clock signal CLK$_H$. Specifically, when the clock signal CLK$_H$ is in a logic low state (e.g., the logic value '0' or a ground voltage), the switches SW$_2$ and SW$_3$ are both deactivated, and when the clock signal CLK$_H$ is in a logic high state (e.g., the voltage level VDD2), the switches SW$_2$ and SW$_3$ are both activated. When the clock signal CLK'$_H$ is in a logic low state (e.g., the logic value '0' or a ground voltage), the switches SW'$_2$ and SW'$_3$ are both deactivated, and when the clock signal CLK'$_H$ is in a logic high state (e.g., the voltage level VDD2), the switches SW'$_2$ and SW'$_3$ are both activated. The operations of the voltage generating circuit 130 shown in FIG. 10 will be described in the detail below.

Figure 11A:
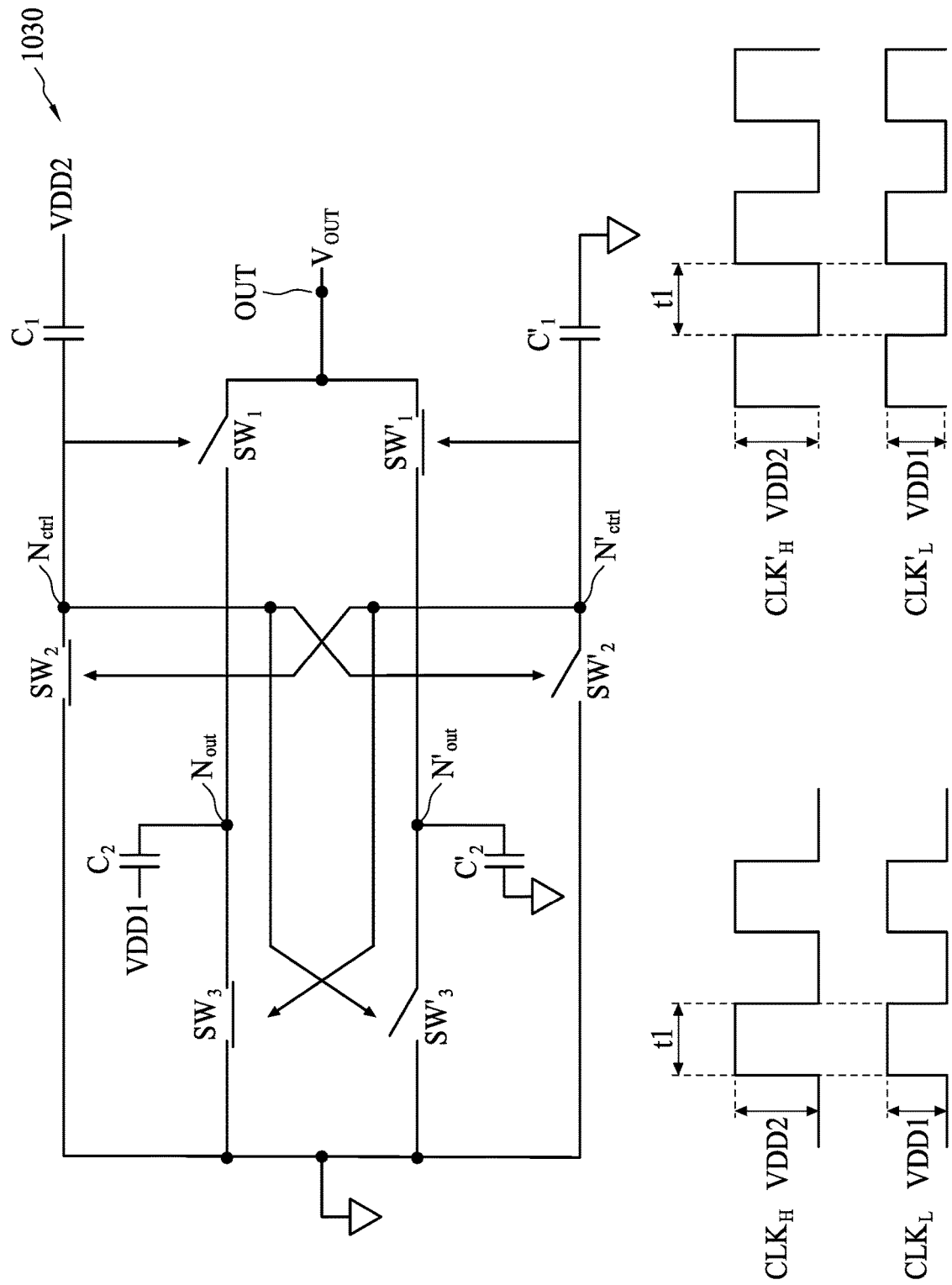
FIG. 11A to FIG. 11C are diagrams illustrating a voltage generating system operating in different modes according to another embodiment of the present disclosure.
Figure 11B:
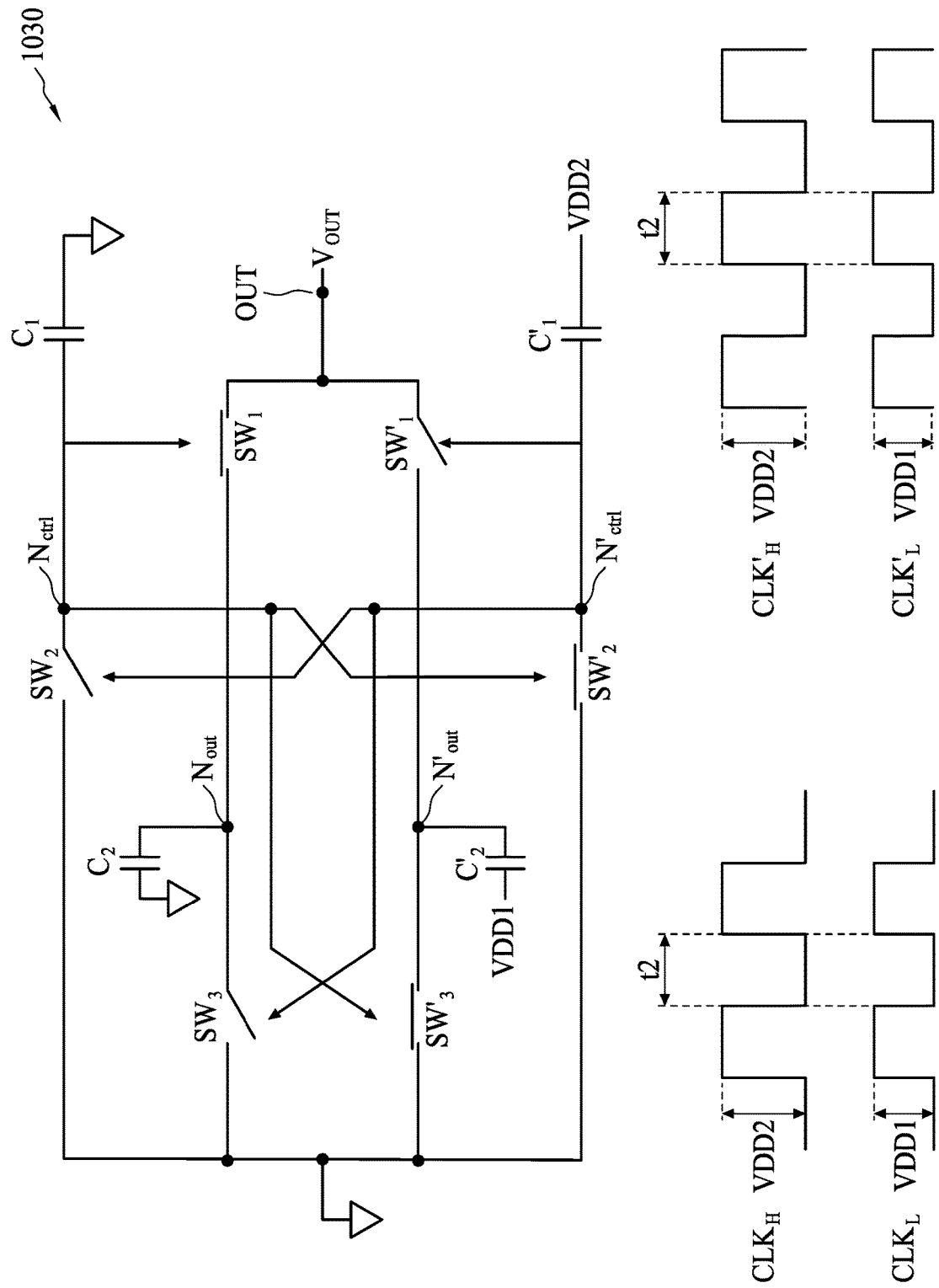
Figure 11C:
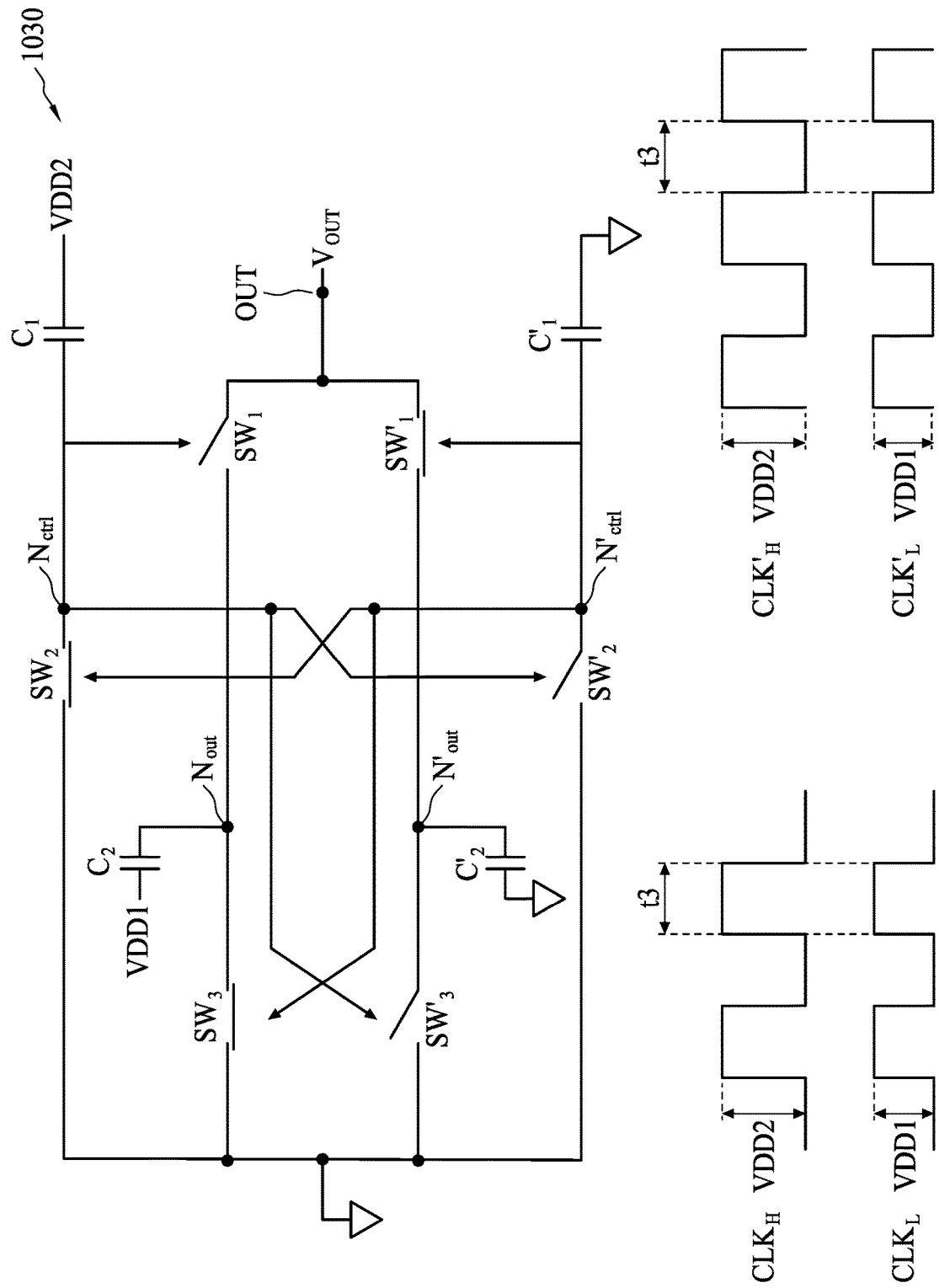

FIG. 11A and FIG. 11C are diagrams illustrating a voltage generating circuit operating in different modes according to an embodiment of the present disclosure. In FIG. 11A, the clock signals CLK$_H$ and CLK$_L$ are both in the logic high state (e.g., the voltage levels VDD2 and VDD1) during the time period t1. The switches SW$_2$ and SW$_3$ are accordingly activated. With such configurations, the one terminal of the capacitor C$_1$ is coupled to the voltage level VDD2 voltage while the other terminal of the capacitor C$_1$ is coupled to the ground voltage via the switch SW$_2$. One terminal of the capacitor C$_2$ is coupled to the voltage level VDD1 while the other terminal of the capacitor C$_2$ is coupled to the ground voltage via the switch SW$_3$. Meanwhile, the voltage level on the control node N$_{ctrl}$ controlling the switch SW$_1$ is the ground voltage. As a result, the switch SW$_1$ is kept deactivated because another terminal of the switch SW$_1$ is also coupled to the ground voltage, and the voltage difference between the control node N$_{ctrl}$ and the output node N$_{out}$, which is zero, is not large enough to activate the switch SW$_1$.

In FIG. 11B, the clock signals CLK$_H$ and CLK$_L$ are both in the logic low state (e.g., the logic low value or the ground voltage) during the time period t2. The switches SW$_2$ and SW$_3$ are accordingly deactivated. According to the law of charge conservation, when the terminal of the capacitor C$_1$, which was coupled to the voltage level VDD2 in the time period t1, is coupled to the ground voltage in the time period t2, the voltage level on the other terminal of the capacitor C$_1$, which was coupled to the ground voltage in the time period t1, is decreased to −VDD2 in the time period t2. Likewise, when the terminal of the capacitor C$_2$, which was coupled to the voltage level VDD1 in the time period t1, is coupled to the ground voltage in the time period t2, the voltage level on the other terminal of the capacitor C$_2$, which was coupled to the ground voltage in the time period t1, is decreased to −VDD1 in the time period t2. Because the voltage level on the control node N$_{ctrl}$ controlling the switch SW$_1$ is decreased to the −VDD2 and the voltage level of the output node N$_{out}$ is −VDD1, the voltage difference between control node N$_{ctrl}$ and the output node N$_{out}$ is large enough to activate the switch SW$_1$. The voltage on the output node N$_{out}$ is thus transmitted to the output terminal OUT via the switch SW$_1$. An output voltage V$_{out}$ which is −VDD1 is thus acquired at the output terminal OUT.

Meanwhile, the clock signals CLK'$_H$ and CLK'$_L$ are both in the logic high state (e.g., the voltage levels VDD2 and VDD1) during the time period t2. The switches SW'$_2$ and SW'$_3$ are accordingly activated. With such configurations, one terminal of the capacitor C'$_1$ is coupled to the voltage level VDD2 while the other terminal of the capacitor C'$_1$ is coupled to the ground voltage via the switch SW'$_2$. One terminal of the capacitor C'$_2$ is coupled to the voltage level VDD1 while the other terminal of the capacitor C'$_2$ is coupled to the ground voltage via the switch SW'$_3$. Meanwhile, the voltage level on the control node N'$_{ctrl}$ controlling the switch SW'$_1$ is the ground voltage. As a result, the switch SW'$_1$ is kept deactivated because another terminal of the switch SW'$_1$ is also coupled to the ground voltage, and the voltage difference between the control node N'$_{ctrl}$ and the output node N'$_{out}$, which is zero, is not large enough to activate the switch SW'$_1$.

In FIG. 11C, the clock signals CLK'$_H$ and CLK'$_L$ are both in the logic low state (e.g., the logic low value or the ground voltage) during the time period t3. The switches SW'$_2$ and SW'$_3$ are accordingly deactivated. According to the law of charge conservation, when the terminal of the capacitor C'$_1$, which was coupled to the voltage level VDD2 in the time period t2, is coupled to the ground voltage in the time period t3, the voltage level on the other terminal of the capacitor C'$_1$, which was coupled to the ground voltage in the time period t2, is decreased to −VDD2 in the time period t3. Likewise, when the terminal of the capacitor C'$_2$, which was coupled to the voltage level VDD1 in the time period t2, is coupled to the ground voltage in the time period t3, the voltage level on the other terminal of the capacitor C'$_2$, which was coupled to the ground voltage in the time period t2, is decreased to −VDD1 in the time period t3. Because the voltage level on the control node N'$_{ctrl}$ controlling the switch SW'$_1$ is decreased to the −VDD2 and the voltage level of the output node N'$_{out}$ is −VDD1, the voltage difference between the control node N'$_{ctrl}$ and the output node N'$_{out}$ is large enough to activate the switch SW'$_1$. The voltage on the output node N'$_{out}$ is thus transmitted to the output terminal OUT via the switch SW'$_1$. The output voltage V$_{out}$ which is −VDD1 is thus acquired at the output terminal OUT. Therefore, when the voltage generating circuit 130 shown in FIG. 10 is adapted, the output voltage V$_{out}$ which is −VDD1 can be acquired at the output terminal in every time period.

Figure 12:
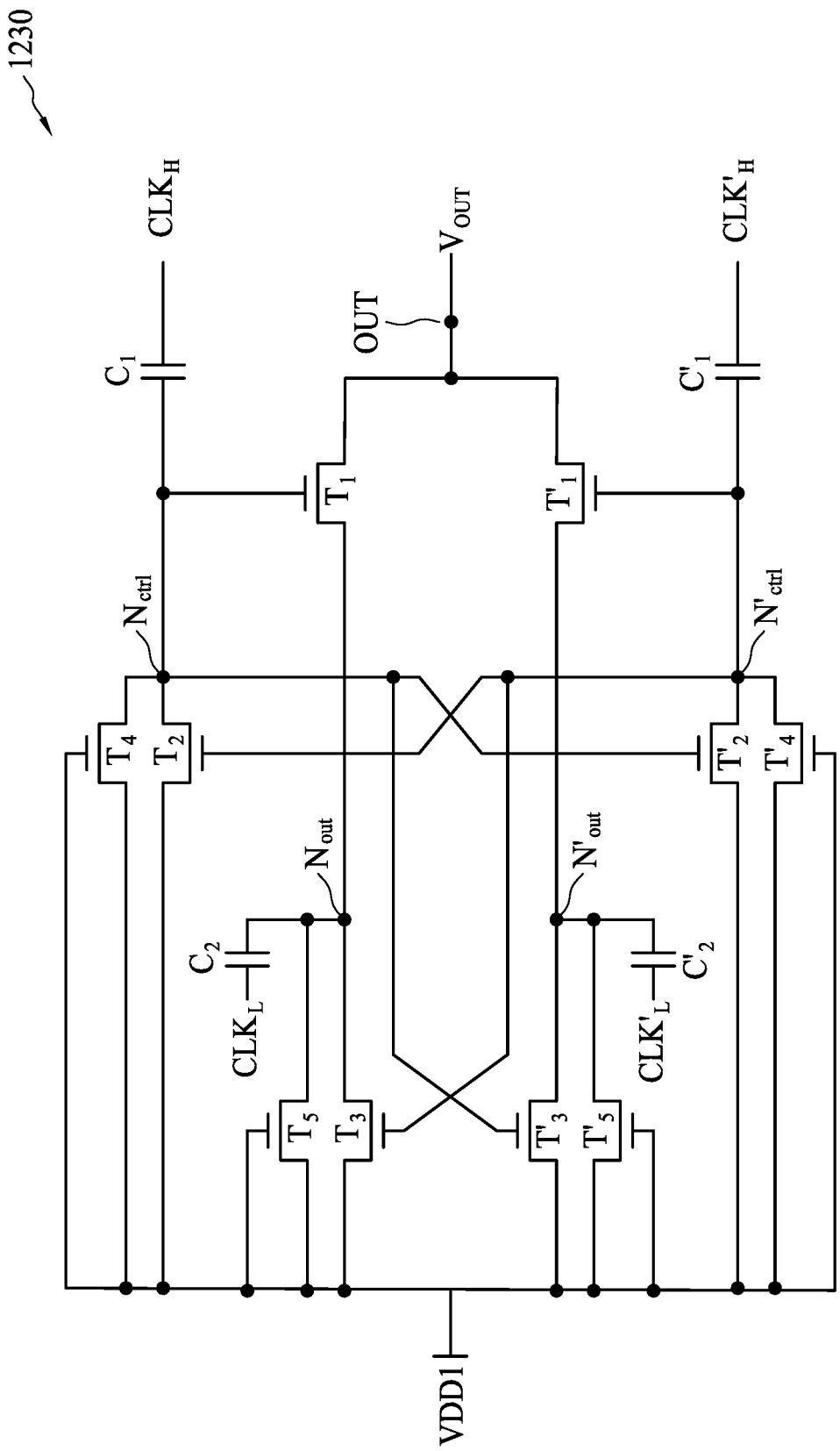
FIG. 12 is a diagram illustrating a voltage generating circuit according to another embodiment of the present disclosure.

FIG. 12 is a diagram illustrating a voltage generating circuit 1230 according to another embodiment of the present disclosure. The voltage generating circuit 1230 shown in FIG. 12 may be adapted to implement the voltage generating circuit 830 shown in FIG. 8. In this embodiment, the switches SW$_1$ to SW$_3$ and SW'$_1$ to SW'$_3$ shown in FIG. 8 are implemented by N-type Metal-Oxide-Semiconductor Field-Effect Transistors (MOSFETs) T$_1$ to T$_3$ and T'$_1$ to T'$_3$, respectively. The voltage generating circuit 130 may further include an N-MOSFET T$_4$ which is a diode-connected transistor connected to the N-MOSFET T$_2$ in parallel, and an N-MOSFET T$_5$ which is a diode-connected transistor connected to the N-MOSFET T$_3$ in parallel. Furthermore, the voltage generating circuit 130 may further include an N-MOSFET T'$_4$ which is a diode-connected transistor connected to the N-MOSFET T'$_2$ in parallel, and an N-MOSFET T'$_5$ which is a diode-connected transistor connected to the N-MOSFET T'$_3$ in parallel. Those skilled in the art should readily understand the operation of the voltage generating circuit 130 shown in FIG. 10 after reading the abovementioned embodiments. The detailed description is omitted here for brevity.

Figure 13:
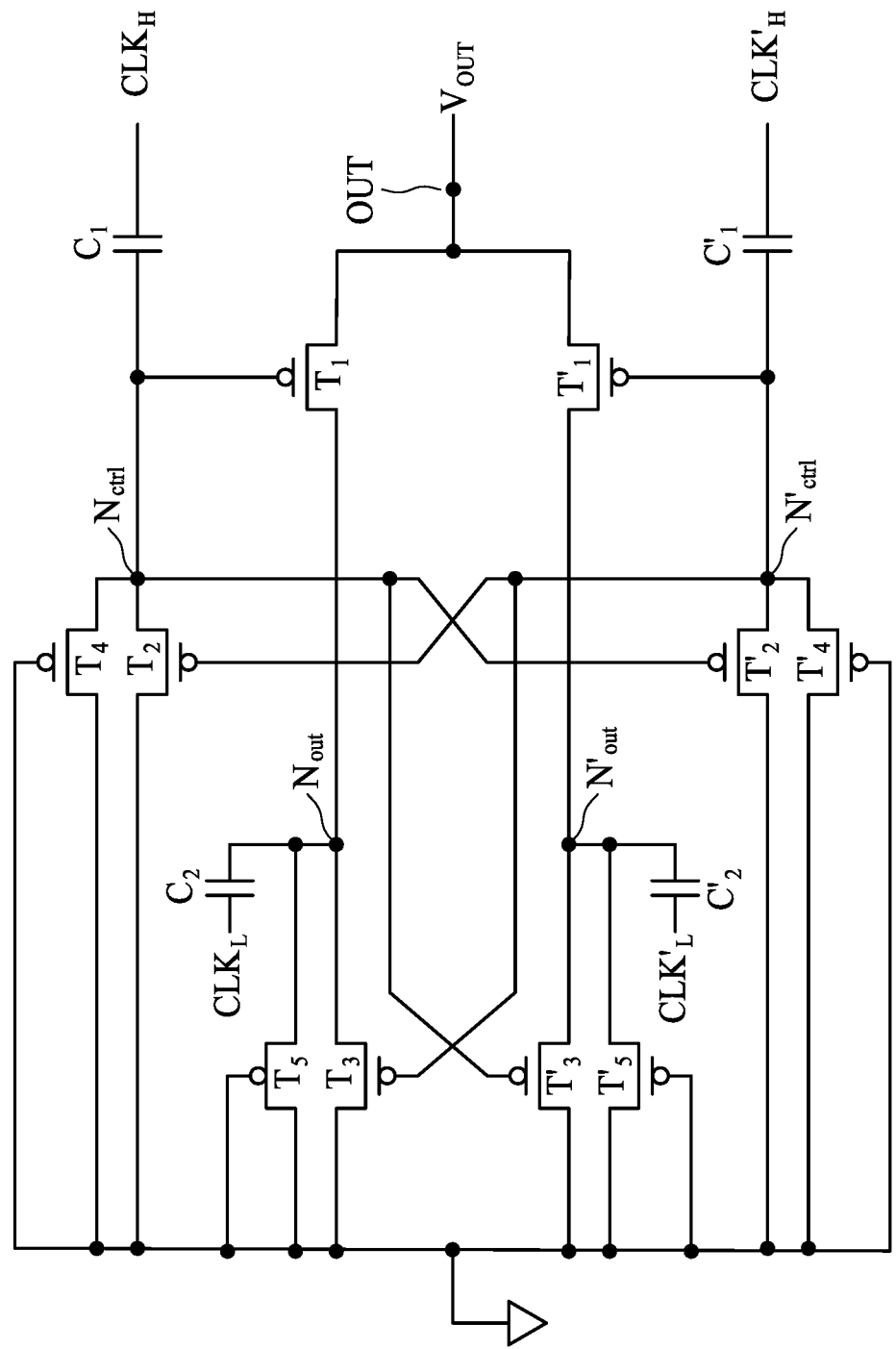
FIG. 13 is a diagram illustrating a voltage generating circuit according to yet another embodiment of the present disclosure.

FIG. 13 is a diagram illustrating a voltage generating circuit 130 according to another embodiment of the present disclosure. The voltage generating circuit 1330 shown in FIG. 13 may be adapted to implement the voltage generating circuit 1030 shown in FIG. 10. In this embodiment, the switches $SW_1$ to $SW_3$ and $SW'_1$ to $SW'_3$ shown in FIG. 13 are implemented by P-type Metal-Oxide-Semiconductor Field-Effect Transistors (MOSFETs) $T_1$ to $T_3$ and $T'_1$ to $T'_3$, respectively. The voltage generating circuit 130 may further include a P-MOSFET $T_4$ which is a diode-connected transistor connected to the P-MOSFET $T_2$ in parallel, and a P-MOSFET $T_5$ which is a diode-connected transistor connected to the P-MOSFET $T_3$ in parallel. Furthermore, the voltage generating circuit 130 may further include a P-MOSFET $T'_4$ which is a diode-connected transistor connected to the P-MOSFET $T'_2$ in parallel, and a P-MOSFET $T'_5$ which is a diode-connected transistor connected to the P-MOSFET $T'_3$ in parallel. Those skilled in the art should readily understand the operation of the voltage generating circuit 130 shown in FIG. 13 after reading the abovementioned embodiments. The detailed description is omitted here for brevity. In addition, when there is only one voltage generating circuit 1330 shown in FIG. 13 is adapted by the voltage generating system 100, the capacitors $C_1$, $C'_1$, $C_2$, and $C'_2$ may be implemented by thin oxide P-type MOSFETs as Metal-Oxide-Semiconductor Capacitor (MOSC). Those skilled in the art should understand these alternative designs. The detail description is omitted here for brevity.

Figure 14:
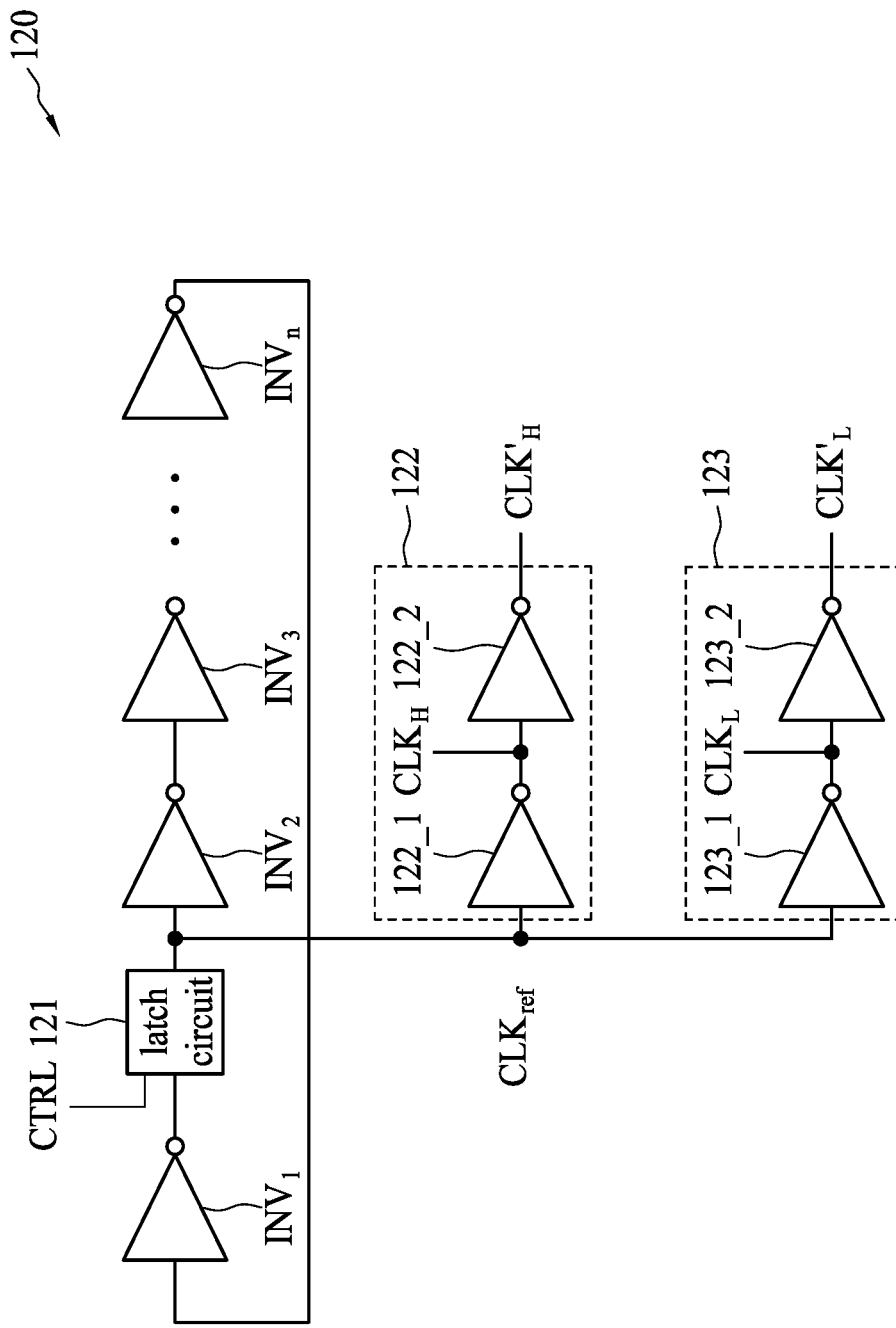
FIG. 14 is a diagram illustrating a clock generating circuit according to according to an embodiment of the present disclosure.

FIG. 14 is a diagram illustrating the clock generating circuit 120 according to an embodiment of the present disclosure. The clock generating circuit 120 includes a plurality of inverters $INV_1$, $INV_2$, ..., and $INV_n$, where n is a positive number. The plurality of inverters $INV_1$, $INV_2$, ..., and $INV_n$ are configured as a ring oscillator. Those skilled in the art should readily understand the implementation of a ring oscillator. The detailed description is omitted here for brevity. The clock generating circuit 120 further includes a latch circuit 121 coupled between two of the plurality of inverters $INV_1$, $INV_2$, ..., and $INV_n$. For example, the latch circuit 121 is coupled between the inverters $INV_1$ and $INV_2$ as shown in FIG. 14. The latch circuit is arranged to generate a reference clock signal $CLK_{ref}$ according to a control signal CTRL. In this embodiment, the latch circuit 121 is implemented by a SR-latch. However, this should not be limited by the present disclosure.

Due to the function of the SR-latch, the profile of the clock signal $CLK_{ref}$ can be stored in the latch circuit when the voltage generating system 100 turns off. When next time the voltage generating system 100 turns on, the latch circuit 121 outputs the reference clock signal $CLK_{ref}$ with the same profile before the voltage generating system 100 turns off. The clock generating circuit 120 further includes delay circuits 122 and 123. The delay circuit 122 includes inverters 122_1 and 122_2 for delaying the reference clock signal $CLK_{ref}$ to generate the clock signals $CLK_H$ and $CLK'_H$ described in the embodiments of FIGS. 2, 4, 6, 8 and 10. Likewise, the delay circuit 123 includes inverters 123_1 and 123_2 for delaying the reference clock signal $CLK_{ref}$ to generate the clock signals $CLK_L$ and $CLK'_L$ described in the embodiments of FIGS. 2, 4, 6, 8 and 10. When the voltage generating system 100 turns on again, the profiles of the clock signals $CLK_H$, $CLK'_H$, $CLK_L$ and $CLK'_L$ remain the same before the voltage generating system 100 turns off.

With such configurations, the situation that all clock signals generated by the clock generating system 120 are pulled up to the logic high value at the moment when the voltage generating system turns on can be avoided. The Electromagnetic Interference (EMI) generated by the voltage generating system 100 can be effectively reduced to protect all the circuits coupled to the voltage generating system 100.

In this embodiment, an amplitude of the reference clock signal $CLK_{ref}$ is identical with the amplitude of the clock signals $CLK_H$ and $CLK'_H$, i.e. the voltage level VDD2. Therefore, to generate the clock signals $CLK_L$ and $CLK'_L$, whose amplitudes are the voltage level VDD1, by delaying the reference clock signal $CLK_{ref}$, a supply voltage adapted by the inverters 123_1 and 123_2 is VDD1 in this embodiment. However, this is not a limitation of the present disclosure. In other embodiments, an amplitude of the reference clock signal $CLK_{ref}$ is identical with the amplitude of the clock signals $CLK_L$ and $CLK'_L$, i.e. the voltage level VDD1. Those skilled in the art should readily understand the alternative implementations of the inverters 122_1 and 122_2 to generate the clock signal $CLK_H$ and $CLK'_H$ according to the reference clock signal $CLK_{ref}$. The detailed description is omitted here for brevity.

Figure 15:
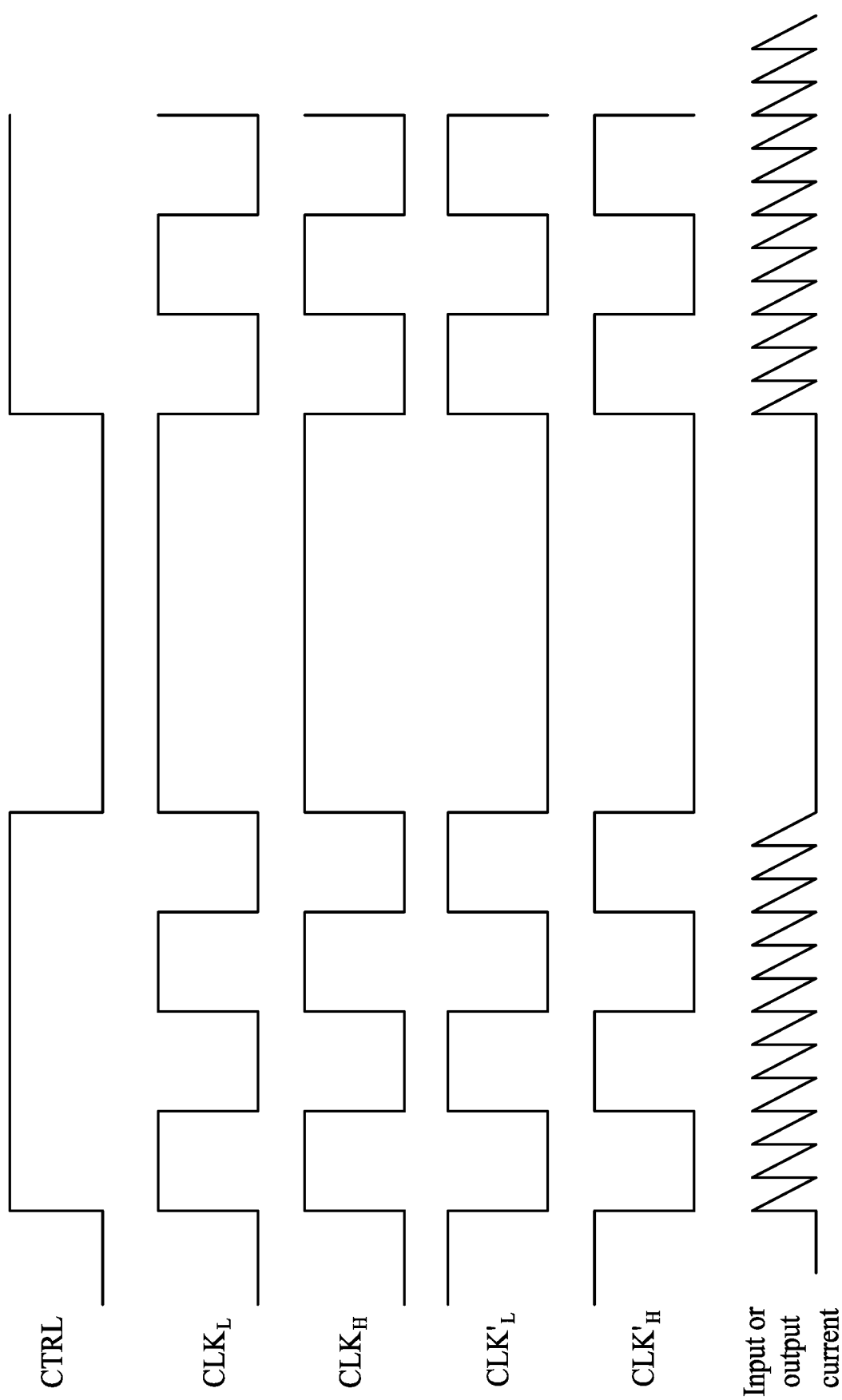
FIG. 15 is a diagram illustrating waveforms of clock signals according to according to an embodiment of the present disclosure.

FIG. 15 is a diagram illustrating waveforms of the clock signals $CLK_H$, $CLK'_H$, $CLK_L$ and $CLK'_L$ according to according to an embodiment of the present disclosure. As shown in FIG. 15, when the control signal CTRL is pulled up to a logic high value, that is, the voltage generating system 100 turns on, the latch circuit 121 stores the profiles of the clock signals $CLK_H$, $CLK'_H$, $CLK_L$ and $CLK'_L$ before the voltage generating system 100 turns off last time. Therefore, the profiles of the clock signals $CLK_H$, $CLK'_H$, $CLK_L$ and $CLK'_L$ remain the same to avoid the situation that the clock signals $CLK_H$, $CLK'_H$, $CLK_L$ and $CLK'_L$ are pulled up to the logic high value together. With such configurations, the input or output current generated by the voltage generating system 100 are averagely spread to reduce the EMI of the voltage generating system 100 and effectively protect all the circuits coupled to the voltage generating system 100.

Figure 16:
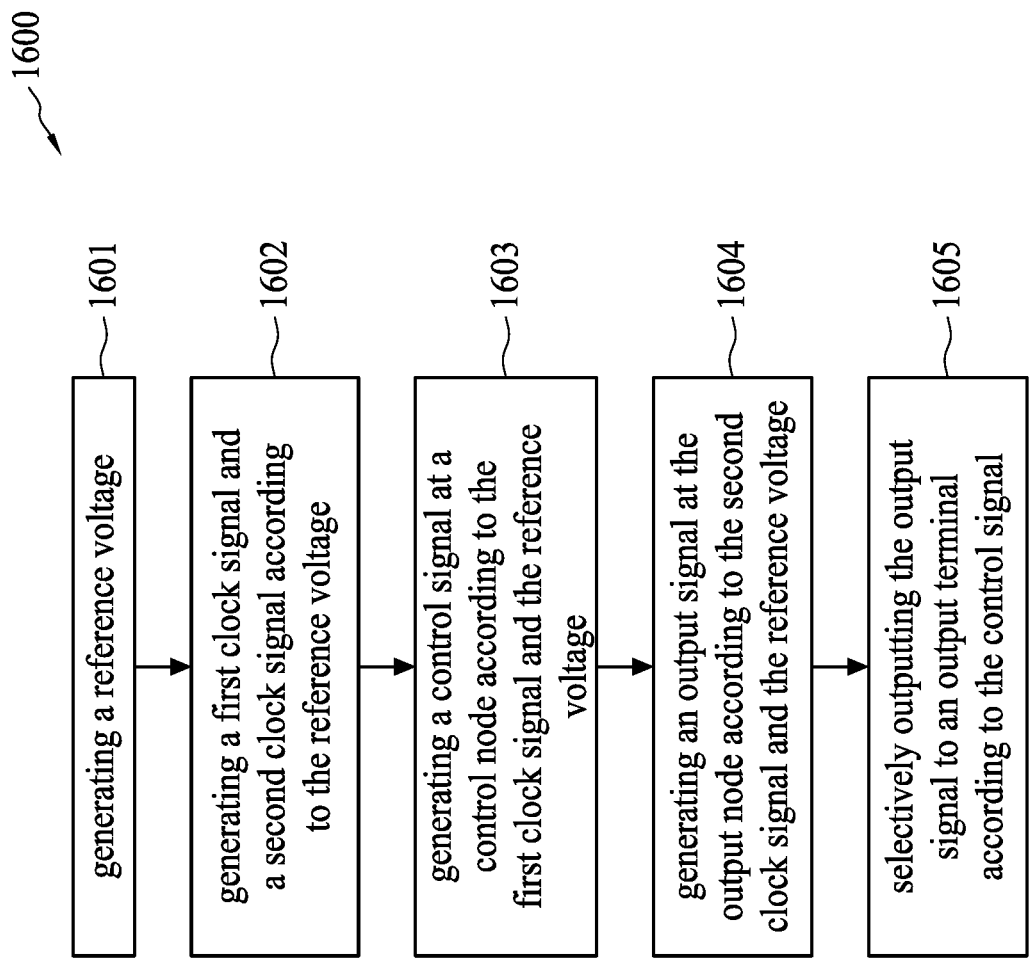
FIG. 16 is a flowchart illustrating a voltage generating method according to an embodiment of the present disclosure.

FIG. 16 is a flowchart illustrating a voltage generating method 1600 according to an embodiment of the present disclosure. Provided that the results are substantially the same, the order shown in FIG. 16 are not required to be executed in the exact order. The method is summarized as follows.

In step 1601: a reference voltage is generated.

In step 1602: a first clock signal and a second clock signal are generated according to the reference voltage, wherein a first amplitude of the first clock signal is greater than the reference voltage and a second amplitude of the second clock signal.

In step 1603: a control signal is generated at a control node according to the first clock signal and the reference voltage.

In step 1604: an output signal is generated at the output node according to the second clock signal and the reference voltage, wherein an absolute value of a third amplitude of the output signal is greater than the reference voltage while an absolute value of a fourth amplitude of the control signal is greater than the reference voltage.

In step 1605: the output signal is selectively outputted to an output terminal according to the control signal Those skilled in the art should readily understand the method 1600 after reading the abovementioned embodiments. The detailed description is omitted here for brevity.

In some embodiments, a voltage generating system is disclosed, including: a voltage source, a clock generating circuit, and a voltage generating circuit. The voltage source is arranged to generate a reference voltage. The clock generating circuit is arranged to generate a first clock signal and a second clock signal according to the reference voltage, wherein a first amplitude of the first clock signal is greater than the reference voltage and a second amplitude of the second clock signal; and the voltage generating circuit including an output node, a control node, an output circuit and a switch circuit. The output circuit coupled to the clock generating circuit is arranged to generate a control signal at the control node according to the first clock signal and the reference voltage, generate an output signal at the output node according to the second clock signal and the reference voltage. An absolute value of a third amplitude of the output signal is greater than the reference voltage while an absolute value of a fourth amplitude of the control signal is greater than the reference voltage. The switch circuit coupled to the output circuit and the voltage source is arranged to selectively output the output signal to an output terminal according to the control signal.

In some embodiments, a voltage generating circuit is disclosed, including: an output node, a control node, an output circuit and a switch circuit. The output circuit is arranged to generate a control signal at the control node according to a first clock signal and a reference voltage, generate an output signal at the output node according to a second clock signal and the reference voltage. A first amplitude of the first clock signal is greater than the reference voltage and a second amplitude of the second clock signal. An absolute value of a third amplitude of the output signal is greater than the reference voltage while an absolute value of a fourth amplitude of the control signal is greater than the reference voltage. The switch circuit is arranged to selectively output the output signal to an output terminal according to the control signal.

In some embodiments, a voltage generating method is disclosed, including: generating a reference voltage; generating a first clock signal and a second clock signal according to the reference voltage, wherein a first amplitude of the first clock signal is greater than the reference voltage and a second amplitude of the second clock signal; and generating a control signal at a control node according to the first clock signal and the reference voltage; generating an output signal at the output node according to the second clock signal and the reference voltage, wherein an absolute value of a third amplitude of the output signal is greater than the reference voltage while an absolute value of a fourth amplitude of the control signal is greater than the reference voltage; and selectively outputting the output signal to an output terminal according to the control signal.

What is claimed is:

1. A voltage generating system, comprising:
   a voltage source, arranged to generate a reference voltage ($V_{ref}$);
   a clock generating circuit, arranged to generate a first clock signal ($CLK_H$) and a second clock signal ($CLK_L$) according to the reference voltage, wherein a first amplitude (VDD2) of the first clock signal is greater than the reference voltage and a second amplitude (VDD1) of the second clock signal; and
   a voltage generating circuit, comprising:
      an output node ($N_{out}$) and a control node ($N_{ctrl}$);
      an output circuit, coupled to the clock generating circuit, wherein the output circuit is arranged to generate a control signal (CTRL) at the control node according to the first clock signal and the reference voltage, generate an output signal ($V_{out}$) at the output node according to the second clock signal and the reference voltage, and an absolute value of a third amplitude of the output signal is greater than the reference voltage while an absolute value of a fourth amplitude of the control signal is greater than the reference voltage; and
      a switch circuit, coupled to the output circuit and the voltage source, wherein the switch circuit is arranged to selectively output the output signal to an output terminal (OUT) according to the control signal.

2. The voltage generating system of claim 1, wherein the reference voltage is a positive voltage, and the third amplitude of the output signal is twice the reference voltage.

3. The voltage generating system of claim 2, wherein the switch circuit includes a first switch, a second switch, and a third switch, and each of the first switch, the second switch and the third switch comprises an N-type Metal-Oxide-Semiconductor Field-Effect Transistor (MOSFET).

4. The voltage generating system of claim 1, wherein the reference voltage is a ground voltage, and the absolute value of the third amplitude of the output signal is the reference voltage.

5. The voltage generating system of claim 4, wherein the switch circuit includes a first switch, a second switch, and a third switch, and each of the first switch, the second switch and the third switch comprises a P-type Metal-Oxide-Semiconductor Field-Effect Transistor (MOSFET).

6. The voltage generating system of claim 1, wherein the output circuit comprises:
   a first capacitor coupled between the first clock signal and the control node, wherein the first capacitor is arranged to output the control signal with the fourth amplitude to the control node; and
   a second capacitor coupled between the second clock signal and the output node, wherein the second capacitor is arranged to output the output signal with the third amplitude to the output node;
   wherein the absolute value of the fourth amplitude equals to the first amplitude plus the reference voltage, and the absolute value of the third amplitude equals to the second amplitude plus the reference voltage.

7. The voltage generating system of claim 6, wherein the switch circuit further comprises:
   a first switch, coupled between the first capacitor and the second capacitor, wherein the first switch is arranged to selectively transmit the output signal to the output terminal according to the control signal.

8. The voltage generating system of claim 7, wherein the switch circuit comprises:
   a second switch coupled between the reference voltage and the control node, wherein the second switch is arranged to selectively transmit the reference voltage to the control node; and
   a third switch coupled between the reference voltage and the output node, wherein the third switch is arranged to selectively transmit the reference voltage to the output node.

9. The voltage generating system of claim 1, wherein the voltage generating circuit is a first voltage generating circuit, the output circuit is a first output circuit, the switch circuit is a first switch circuit, the output signal is a first output signal, the control signal is a first control signal, the output terminal is a first output terminal, the output node is a first output node, and the control node is a first control node, further comprising:

a second voltage generating circuit, comprising:
   a second output node and a second control node;
   a second output circuit, coupled to the clock generating circuit, wherein the second output circuit is arranged to receive the first output signal at the second output node and the second control node, and generate a second output signal and a second control signal at least according to the first output signal, and an absolute value of a fifth amplitude of the second output signal is greater than the absolute value of the third amplitude while an absolute value of a sixth amplitude of the second control signal is greater than the absolute value of the third amplitude; and
   a second switch circuit, coupled to the second output circuit and the voltage source, wherein the second switch circuit is arranged to selectively output the second output signal to a second output terminal.

10. The voltage generating system of claim 1, wherein the clock generating circuit comprises:
   a plurality of inverters;
   a latch circuit coupled between two of the plurality of inverters, wherein the latch circuit is arranged to output a reference clock signal;
   a first delay circuit, coupled to the latch circuit, wherein the first delay circuit is arranged to generate the first clock signal according to the reference clock signal; and
   a second delay circuit, coupled to the latch circuit, wherein the second delay circuit is arranged to generate the second clock signal according to the reference clock signal.

11. The voltage generating system of claim 10, wherein the first delay circuit comprises a first inverter to generate the first clock signal by delaying the reference clock, and the second delay circuit comprises a second inverter to generate the second clock signal by delaying the reference clock.

12. The voltage generating system of claim 11, wherein an amplitude of the reference clock signal equals to the first amplitude of the first clock signal, and a supply voltage coupled to the second inverter is the second amplitude of the second clock signal.

13. A voltage generating circuit, comprising:
   an output node ($N_{out}$) and a control node ($N_{ctrl}$);
   an output circuit, arranged to generate a control signal (CTRL) at the control node according to a first clock signal ($CLK_H$) and a reference voltage ($V_{ref}$), generate an output signal ($V_{out}$) at the output node according to a second clock signal ($CLK_L$) and the reference voltage, wherein a first amplitude (VDD2) of the first clock signal is greater than the reference voltage and a second amplitude (VDD1) of the second clock signal, and an absolute value of a third amplitude of the output signal is greater than the reference voltage while an absolute value of a fourth amplitude of the control signal is greater than the reference voltage; and
   a switch circuit, arranged to selectively output the output signal to an output terminal (OUT) according to the control signal.

14. The voltage generating circuit of claim 13, wherein the reference voltage is a positive voltage, and the third amplitude of the output signal is twice the reference voltage.

15. The voltage generating circuit of claim 13, wherein the reference voltage is a ground voltage, and the absolute value of the third amplitude of the output signal is the reference voltage.

16. The voltage generating circuit of claim 13, wherein the output circuit comprises:
   a first capacitor coupled between the first clock signal and the control node, wherein the first capacitor is arranged to output the control signal with the fourth amplitude to the control node; and
   a second capacitor coupled between the second clock signal and the output node, wherein the second capacitor is arranged to output the output signal with the third amplitude to the output node;
   wherein the absolute value of the fourth amplitude equals to the first amplitude plus the reference voltage, and the absolute value of the third amplitude equals to the second amplitude plus the reference voltage.

17. The voltage generating circuit of claim 16, wherein the switch circuit further comprises:
   a first switch, coupled between the first capacitor and the second capacitor, wherein the first switch is arranged to selectively transmit the output signal to the output terminal according to the control signal.

18. The voltage generating circuit of claim 16, wherein the switch circuit comprises:
   a second switch coupled between the reference voltage and the control node, wherein the second switch is arranged to selectively transmit the reference voltage to the control node; and
   a third switch coupled between the reference voltage and the output node, wherein the third switch is arranged to selectively transmit the reference voltage to the output node.

19. A voltage generating method, comprising:
   generating a reference voltage ($V_{ref}$);
   generating a first clock signal ($CLK_H$) and a second clock signal ($CLK_L$) according to the reference voltage, wherein a first amplitude (VDD2) of the first clock signal is greater than the reference voltage and a second amplitude (VDD1) of the second clock signal;
   generating a control signal (CTRL) at a control node ($N_{ctrl}$) according to the first clock signal and the reference voltage;
   generating an output signal ($V_{out}$) at an output node according to the second clock signal and the reference voltage, wherein an absolute value of a third amplitude of the output signal is greater than the reference voltage while an absolute value of a fourth amplitude of the control signal is greater than the reference voltage; and
   selectively outputting the output signal to an output terminal (OUT) according to the control signal.

20. The voltage generating method of claim 19, wherein the reference voltage is a positive voltage and the third amplitude of the output signal is twice the reference voltage; or the reference voltage is a ground voltage and the absolute value of the third amplitude of the output signal is the reference voltage.

* * * * *